United States Patent [19]

Shibayama et al.

[11] Patent Number: 4,835,535
[45] Date of Patent: May 30, 1989

[54] DIGITAL-TO-ANALOG CONVERTING APPARATUS EQUIPPED WITH CALIBRATING FUNCTION

[75] Inventors: Akinori Shibayama, Tokyo; Hironobu Niijima, Tatebayashi, both of Japan

[73] Assignees: Nippon Telegraph & Telephone Public Corporation; Takeda Riken Kogyo Kabushikikaisha, both of Tokyo, Japan

[21] Appl. No.: 22,483

[22] Filed: Mar. 6, 1987

Related U.S. Application Data

[63] Continuation of Ser. No. 484,612, Apr. 13, 1983, abandoned.

[30] Foreign Application Priority Data

Jun. 16, 1982 [JP] Japan .................................. 57-64166

[51] Int. Cl.⁴ ............................................. H03K 13/02
[52] U.S. Cl. .................................................. 341/120
[58] Field of Search ................. 340/347 DA, 347 CC, 340/347 M

[56] References Cited

U.S. PATENT DOCUMENTS 3,217,147 11/1965 Chapman, Jr. ............. 340/347 M X
4,272,760 6/1981 Prazak et al. ................. 340/347 CC
4,336,526 6/1982 Weir .......................... 340/347 CC X

OTHER PUBLICATIONS

Rullgard, Controlling a Number of Predetermined Currents, IBM Technical Disclosure Bulletin, vol. 10, No. 1, 6/1967, pp. 5 & 6.
The Engineering Staff of Analog Devices, Inc., Analog-Digital Conversion Handbook, 6/1972, pp. I-8 & 9; I-54 to 59; II-20 & 21.

Primary Examiner—Bernard Roskoski
Attorney, Agent, or Firm—Staas & Halsey

[57] ABSTRACT

In a D/A converting apparatus which provides a converted analog signal at its output terminal by selectively yielding one or more currents from one or more current sources in accordance with an input digital signal, the current sources are selectively actuated to output the currents and an error in the current of each selected current source is obtained from the output derived at the output terminal in response to the outputting of the current. From the current error of each current source is computed a final error corresponding to each input digital signal and corrected data corresponding to the final error is stored in a corrected data memory, which is read out by the input digital signal. The output thus read out is converted into an analog signal, whereby a correct converted output is obtained.

24 Claims, 15 Drawing Sheets

FIG. 3 PRIOR ART

| B1 B2 B3 B4 | 3₁ 3₂ 3₃ 3₄ 3₅ 3₆ 3₇ 3₈ 3₉ 3₁₀ 3₁₁ 3₁₂ 3₁₃ 3₁₄ 3₁₅ |
|---|---|
| 0 0 0 1 | . . . . . . . . . . . . . . O |
| 0 0 1 0 | . . . . . . . . . . . . . O O |
| 0 0 1 1 | . . . . . . . . . . . . O O O |
| 0 1 0 0 | . . . . . . . . . . . O O O O |
| 0 1 0 1 | . . . . . . . . . . O O O O O |
| 0 1 1 0 | . . . . . . . . . O O O O O O |
| 0 1 1 1 | . . . . . . . . O O O O O O O |
| 1 0 0 0 | . . . . . . . O O O O O O O O |
| 1 0 0 1 | . . . . . . O O O O O O O O O |
| 1 0 1 0 | . . . . . O O O O O O O O O O |
| 1 0 1 1 | . . . . O O O O O O O O O O O |
| 1 1 0 0 | . . . O O O O O O O O O O O O |
| 1 1 0 1 | . . O O O O O O O O O O O O O |
| 1 1 1 0 | . O O O O O O O O O O O O O O |
| 1 1 1 1 | O O O O O O O O O O O O O O O |
| | 2₁ 2₂ 2₃ 2₄ 2₅ 2₆ 2₇ 2₈ 2₉ 2₁₀ 2₁₁ 2₁₂ 2₁₃ 2₁₄ 2₁₅ |

FIG. 4A PRIOR ART

| CURRENT SOURCE | ERROR |
|---|---|
| 2₁ | + α |
| 2₂ | + α |
| 2₃ | + α |
| 2₄ | + α |
| 2₅ | + α |
| 2₆ | + α |
| 2₇ | + α |
| 2₈ | + α |
| 2₉ | − α |
| 2₁₀ | − α |
| 2₁₁ | − α |
| 2₁₂ | − α |
| 2₁₃ | − α |
| 2₁₄ | − α |
| 2₁₅ | − α |

FIG. 4B PRIOR ART

| B1 B2 B3 B4 | ERROR |
|---|---|
| 0 0 0 1 | − α |
| 0 0 1 0 | − 2 α |
| 0 0 1 1 | − 3 α |
| 0 1 0 0 | − 4 α |
| 0 1 0 1 | − 5 α |
| 0 1 1 0 | − 6 α |
| 0 1 1 1 | − 7 α |
| 1 0 0 0 | − 6 α |
| 1 0 0 1 | − 5 α |
| 1 0 1 0 | − 4 α |
| 1 0 1 1 | − 3 α |
| 1 1 0 0 | − 2 α |
| 1 1 0 1 | − 1 α |
| 1 1 1 0 | 0 |
| 1 1 1 1 | + α |

FIG. 13A
| T \ I | $I_{of}, I_1 \cdots I_7$ | $I_8$ | $I_{16}$ | $I_{17}$ | $I_{18}$ | $I_{19}$ | $I_{20}$ | $I_{21}$ |
|---|---|---|---|---|---|---|---|---|
| $T_1$ | ○ | ○ | ○ | × | × | × | × | × |
| $T_2$ | ○ | × | ○ | × | × | × | × | × |
FIG. 13B
| T \ I | $I_{of}, I_1 \cdots I_7$ | $I_8$ | $I_{16}$ | $I_{17}$ | $I_{18}$ | $I_{19}$ | $I_{20}$ | $I_{21}$ |
|---|---|---|---|---|---|---|---|---|
| $T_1$ | ○ | ○ | × | ○ | × | × | × | × |
| $T_2$ | ○ | × | ○ | ○ | × | × | × | × |
FIG. 13C
| T \ I | $I_{of}, I_1 \cdots I_7$ | $I_8$ | $I_{16}$ | $I_{17}$ | $I_{18}$ | $I_{19}$ | $I_{20}$ | $I_{21}$ |
|---|---|---|---|---|---|---|---|---|
| $T_1$ | ○ | ○ | × | × | × | × | × | ○ |
| $T_2$ | ○ | × | ○ | ○ | ○ | ○ | ○ | ○ |
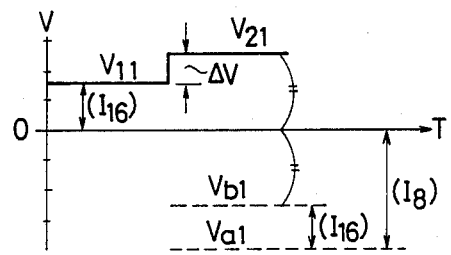
FIG. 14A
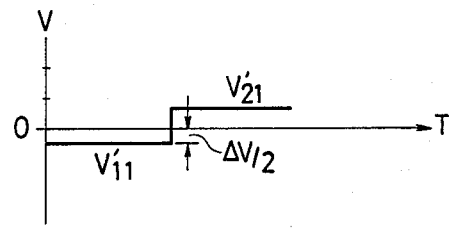
FIG. 14B
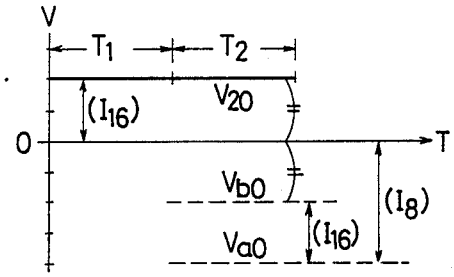
FIG. 14C

FIG. 20

| $B_1$ $B_2$ $B_3$ $B_4$ | ($D_1$ $D_2$ $D_3$ $D_4$ $D_5$ $D_6$ $D_7$ $D_8$ $D_9$ $D_{10}$ $D_{11}$ $D_{12}$ $D_{13}$ $D_{14}$ $D_{15}$) $b_1$ $b_2$ $b_3$ $b_4$ $b_5$ $b_6$ $b_7$ $b_8$ $b_9$ $b_{10}$ $b_{11}$ $b_{12}$ $b_{13}$ $b_{14}$ $b_{15}$ |
|---|---|
| 0 0 0 1 | 0 0 0 0 0 0 0 0 0 0 0 0 0 0 1 |
| 0 0 1 0 | 0 0 0 0 0 0 0 0 0 0 0 0 0 1 0 |
| 0 0 1 1 | 0 0 0 0 0 0 0 0 0 0 0 0 1 0 0 |
| 0 1 0 0 | 0 0 0 0 0 0 0 0 0 0 0 1 0 0 0 |
| 0 1 0 1 | 0 0 0 0 0 0 0 0 0 0 1 0 0 0 0 |
| 0 1 1 0 | 0 0 0 0 0 0 0 0 0 1 0 0 0 0 0 |
| 0 1 1 1 | 0 0 0 0 0 0 0 0 1 0 0 0 0 0 0 |
| 1 0 0 0 | 0 0 0 0 0 0 0 1 0 0 0 0 0 0 0 |
| 1 0 0 1 | 0 0 0 0 0 0 1 0 0 0 0 0 0 0 0 |
| 1 0 1 0 | 0 0 0 0 0 1 0 0 0 0 0 0 0 0 0 |
| 1 0 1 1 | 0 0 0 0 1 0 0 0 0 0 0 0 0 0 0 |
| 1 1 0 0 | 0 0 0 1 0 0 0 0 0 0 0 0 0 0 0 |
| 1 1 0 1 | 0 0 1 0 0 0 0 0 0 0 0 0 0 0 0 |
| 1 1 1 0 | 0 1 0 0 0 0 0 0 0 0 0 0 0 0 0 |
| 1 1 1 1 | 1 0 0 0 0 0 0 0 0 0 0 0 0 0 0 |

FIG. 22

| $B_1$ $B_2$ $B_3$ $B_4$ | $z_1$ $z_2$ $z_3$ $z_4$ $z_5$ $z_6$ $z_7$ $z_8$ $z_9$ $z_{10}$ $z_{11}$ $z_{12}$ $z_{13}$ $z_{14}$ $z_{15}$ $b_1$ $b_2$ $b_3$ $b_4$ $b_5$ $b_6$ $b_7$ $b_8$ $b_9$ $b_{10}$ $b_{11}$ $b_{12}$ $b_{13}$ $b_{14}$ $b_{15}$ |
|---|---|
| 0 0 0 0 | 0 0 0 0 0 0 0 0 0 0 0 0 0 0 0 |
| 0 0 0 1 | 0 0 0 0 0 0 0 0 0 0 0 1 0 0 |
| 0 0 1 0 | 0 0 0 0 0 0 0 1 0 0 0 1 0 0 |
| 0 0 1 1 | 1 0 0 0 0 0 0 1 0 0 0 1 0 0 |
| 0 1 0 0 | 1 0 0 0 1 0 0 0 1 0 0 0 1 0 0 |
| 0 1 0 1 | 1 0 0 0 1 0 0 0 1 0 0 0 1 0 1 |
| 0 1 1 0 | 1 0 0 0 1 0 0 0 1 0 1 0 1 0 1 |
| 0 1 1 1 | 1 0 1 0 1 0 0 0 1 0 1 0 1 0 1 |
| 1 0 0 0 | 1 0 1 0 1 0 1 0 1 0 1 0 1 0 1 |
| 1 0 0 1 | 1 1 1 0 1 0 1 0 1 0 1 0 1 0 1 |
| 1 0 1 0 | 1 1 1 0 1 0 1 0 1 0 1 0 1 1 1 |
| 1 0 1 1 | 1 1 1 1 1 0 1 0 1 0 1 0 1 1 1 |
| 1 1 0 0 | 1 1 1 1 1 0 1 0 1 0 1 1 1 1 1 |
| 1 1 0 1 | 1 1 1 1 1 1 1 0 1 0 1 1 1 1 1 |
| 1 1 1 0 | 1 1 1 1 1 1 1 0 1 1 1 1 1 1 1 |
| 1 1 1 1 | 1 1 1 1 1 1 1 1 1 1 1 1 1 1 1 |

DIGITAL-TO-ANALOG CONVERTING APPARATUS EQUIPPED WITH CALIBRATING FUNCTION

This is a continuation of co-pending application Ser. No. 484,612, filed on Apr. 13, 1983, now abandoned.

BACKGROUND OF THE INVENTION

The present invention relates to a digital-to-analog (hereinafter referred to as D/A) converting apparatus which permits conversion of a digital signal of many bits into an analog signal with high accuracy.

A known D/A converter is of the type in which a plurality of current sources are provided for generating binary weighted currents and, in accordance with an input digital signal, the current sources of the binary-weighted currents are controlled by the corresponding binary bits of the input digital signal to permit or cut off the supply of the binary-weighted currents and then the output currents are added together, thereby to obtain an analog converted output. In such a D/A converting apparatus, when the number of bits of the digital signal to be converted is large, the currents of the current sources corresponding to the least significant bit and the most significant bit of the digital signal markedly differ, which makes it difficult to construct a current source for the most significant bit which yields a current with an error equal to or smaller than that of the current of the current source corresponding to the least significant bit.

To avoid this, it is a general practice in the prior art to convert a plurality of high-order bits of the input digital signal, including the most significant bit, to prepare a plurality of signals for a respective plurality of constant-current sources corresponding to the high-order bits, each of which generates a current corresponding to the least significant one of the high-order bits, and to simultaneously output a number of currents from the high-order bit constant-current sources according to the converted plurality of signals. With this method, it is possible to achieve high-precision D/A conversion and to decrease spike noise, i.e. what is called a glitch, which is generated during switching of the input digital signal.

With this method, however, the current value of the high-order bit current source is very much larger than the current value of the current source corresponding to the least significant bit. Consequently, high precision is needed and it is difficult to hold the current ratio of each current source to the others constant, resulting in degraded linearity of the conversion characteristic. Adjustment for holding the current ratio as predetermined is troublesome and time-consuming and, in addition, this adjustment is often required for each ambient temperature change or secular change.

SUMMARY OF THE INVENTION

It is therefore an object of the present invention to provide a D/A converting apparatus which is capable of converting an input digital signal of many bits into an analog signal with high accuracy, and which has a conversion characteristic of high linearity without necessitating the use of parts having high performance ratings in terms of temperature coefficients and secular change.

Another object of the present invention is to provide a D/A converting apparatus which is capable of automatically calibrating relative errors of currents of a plurality of current sources, and which has excellent linearity in the conversion characteristic.

Yet another object of the present invention is to provide a D/A converting apparatus which is capable of detecting a current error of a current source by a relatively simple-structured and inexpensive error detecting section.

According to the present invention, in a D/A converting mode of a D/A converting apparatus, high-order bits of an input digital signal are converted into analog signals using a plurality of equally weighted current sources for the high-order bits and the remaining bits in the input digital signal are converted into analog signals using a plurality of binary-weighted current sources for low-order bits as is done in the conventional D/A converter, while, in a calibrating mode, at least one reference current source is actuated by selected and cut off by nonselection at least once, and current sources, including at least one current source to be calibrated, are selectively controlled, and then a difference is detected between analog outputs obtained during selection and nonselection of the reference current source, thereby to obtain a current error of the current source to be calibrated. From the current error thus obtained for each high-order bit current source, a final error corresponding to each input digital value is computed, and the input digital signal is corrected on the basis of the final error so that a correct analog signal may be obtained.

One of the high-order bit current sources may be used as the reference current source, on the basis of which the currents of the other high-order bit current sources are calibrated one by one. In this case, during selection of the reference current source the current source to be calibrated is nonselected and vice versa. For the calibration of the low-order bit current sources, one of the high-order bit current sources is used as a reference current source, and during selection of the reference current source a current source to be calibrated is selected and during nonselection of the reference current source the current source to be calibrated and the current sources for the more significant low-order bits are selected. In this way, the difference between the analog converted outputs obtained during selection and nonselection of the reference current source is reduced, and this difference is converted by an A/D converter into a digital signal. A simple-structured A/D converter can be used.

The input digital signal is corrected in a digital manner on the basis of the final error and the corrected digital signal is converted into analog form. Alternatively, a correction analog signal corresponding to the input digital signal is generated an added to the converted analog signal, thus obtaining a correct analog signal.

BRIEF DESCRIPTION OF THE DRAWINGS

FIG. 3 is a diagram showing the relationship between high-order bits of the input digital signal and high-order bit current sources;

FIG. 4A is a diagram showing an example of current error of each of the high-order bit current sources;

FIG. 4B shows errors for the respective high-order 4-bit signals calculated based on FIGS. 3 and 4A;

FIGS. 13A to 13C are diagrams showing examples of the relationship between current source selection and timing during detection of the current error of each intermediate bit current source;

FIGS. 14A to 14C are timing charts showing examples of voltages yielded at the input and output sides of the high-pass filter 24 during detection of a current error of each intermediate bit current source;

FIG. 20 is a diagram showing the contents of the code converter 12 in error detection processing;

FIG. 22 is a diagram showing the contents of the code converter 12 after the error optimizing processing.

DESCRIPTION OF THE PREFERRED EMBODIMENTS

For a better understanding of the present invention, a description will be given first of a conventional D/A converter.

Figure 1:
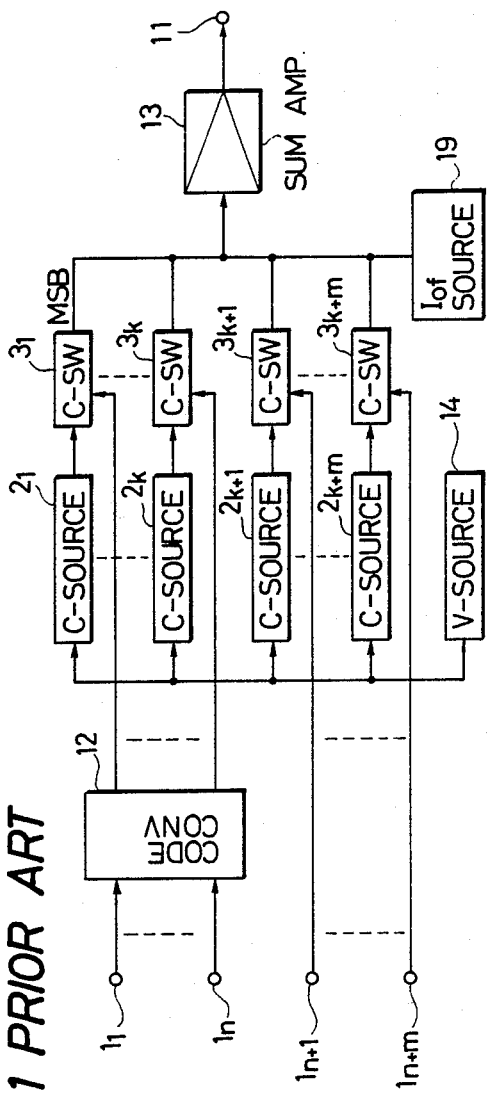
FIG. 1 is a block diagram showing a conventional D/A converting apparatus.

FIG. 1 illustrates an example of the arrangement of a conventional high precision D/A converter. Bit signals $B_1$ to $B_n$ and $B_{n+1}$ to $B_{n+m}$ of a digital signal of parallel bits are provided to digital signal input terminals $1_1$ to $1_n$ and $1_{n+1}$ to $1_{n+m}$, respectively. The digital signals $B_1$ to $B_n$ and $B_{n+1}$ to $B_{n+m}$ are binary-weighted in such a manner that each of the analog output voltages derived at an analog output terminal 11, upon application of the respective input signal, is one half the analog voltage that is produced at the analog output terminal 11 corresponding to the adjacent higher order bit signal. The most significant bits (hereinafter referred to as MSB) $B_1$ to $B_n$ of the signal are applied to a code converting section 12 for conversion into respective signals for a respective number of the current sources. For example, in the case of code-converting four bits of high-order bit signals $B_1$ to $B_4$, the code converting section 12, which has 15 output terminals of the same weight, performs such a code conversion that it produces an output at one or more of the 15 output terminals in accordance with the input signals $B_1$ to $B_4$. By k ($k=2^n-1$) outputs of the code converter 12, the current switches $3_1$ to $3_k$ are controlled, and the current switches $3_{k+1}$ to $3_{k+m}$ are controlled by the digital signals $B_{n+1}$ to $B_{n+m}$. The constant-current sources $2_1$ to $2_k$ yield constant currents of the same weight, and the constant-current sources $2_{k+1}$ to $2_{k+m}$ produce binary-weighted constant currents whose values are $\frac{1}{2}, \frac{1}{4}, \frac{1}{8}, \ldots . 2^{-m}$ times the value of the output current of one of the constant-current sources $2_1$ to $2_k$. Output currents $I_1$ to $I_k$ and $I_{k+1}$ to $I_{k+m}$ of the constant-current sources $2_1$ to $2_k$ and $2_{k+1}$ to $2_{k+m}$ are supplied to an adder 13 in accordance with the control state of the current switches $3_1$ to $3_k$ and $3_{k+1}$ to $3_{k+m}$, and the output of the adder 13 is provided to the output terminal 11. The constant-current sources $2_1$ to $2_k$ and $2_{k+1}$ to $2_{k+m}$ are supplied with an operating constant voltage from a constant-voltage source 14.

Figure 2:
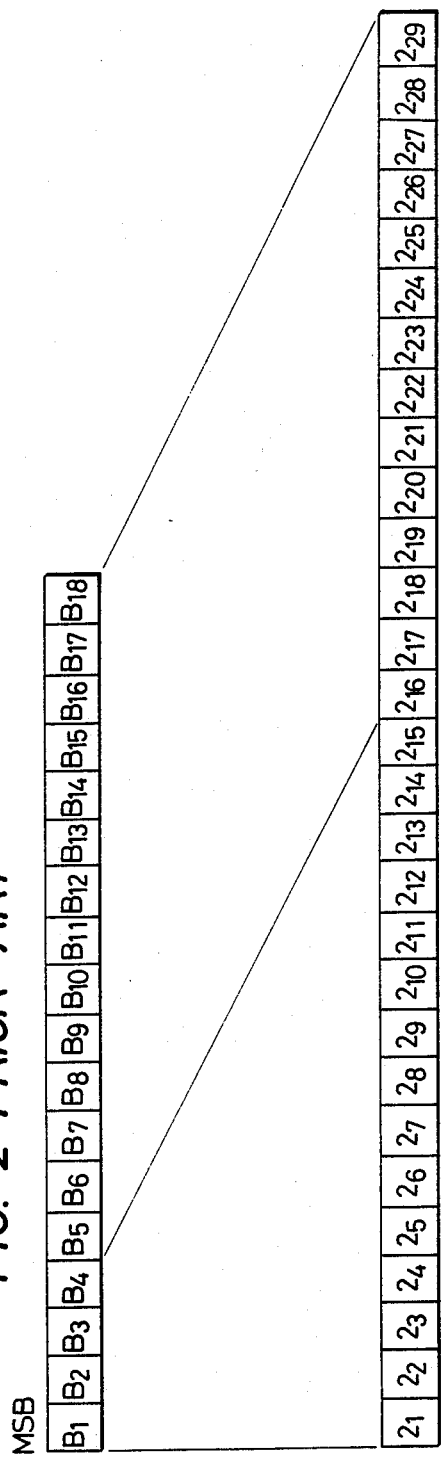
FIG. 2 is a diagram showing an example of the correspondence of each bit of an input digital signal to each current source.

Accordingly, in the case where the four high-order bits of the input digital signal $B_1$ to $B_{18}$ are converted by the code converting section 12 into the respective signals to turn on the respective number of the equal-weight current sources, $2_1$ to $2_k$, the current switches corresponding to the binary numbers of the fourteen low-order bits $B_5$ to $B_{18}$ are controlled, that is, in the case where $k=15$, $n=4$ and $m=14$, the bits $B_1$ to $B_{18}$ of the input digital signal and the constant-current sources $2_1$ to $2_{29}$ bear such a relationship as shown in FIG. 2. The high-order bits $B_1$ to $B_4$ are made to correspond to the constant-current sources $2_1$ to $2_{15}$, which are selected by the outputs of the code converting section 12 corresponding to the numeric value of the binary number of the high-order bits $B_1$ to $B_4$. That is to say, as shown in FIG. 3, when a 4-bit binary signal "0001" corresponding to a decimal 1 is applied to the code converter 12, only the current switch $3_{15}$ is turned ON to output a current from the constant-current source $2_{15}$ alone; when a 4-bit binary signal "0010" corresponding to a decimal 2 is input, two current switches $3_{14}$ and $3_{15}$ are turned ON to output currents from the constant-current sources $2_{14}$ and $2_{15}$; and when "0011" is input, since the corresponding decimal number is 3, three current switches $3_{13}$ to $3_{15}$ are turned ON to provide currents from the constant-current sources $2_{13}$ to $2_{15}$. In this way, currents are provided from a number of the constant-current sources according to the numeric value of the input high-order 4-bit signal. In contrast thereto, the low-order bits $B_5$ to $B_{18}$ have one-to-one correspondence to the constant-current sources $2_{16}$ to $2_{29}$ and currents are output from only the constant-current sources corresponding to the bits being input. Those currents selectively designated in accordance with the input digital signal as explained above are summed up by a summing amplifier 13, which produces at the output terminal 11 a voltage corresponding to the sum of those currents. The prior art D/A converter also comprises an offset current source 19 which produces an offset current $I_{of}$ opposite in polarity to those currents from the constant-current sources $2_1$ to $2_{k+m}$.

With such an arrangement as described above, the current values of the constant-current sources $2_1$ to $2_k$ corresponding to the high-order bits of the input digital signal to be converted need not be made so large and, consequently, the accuracy of the current values can be raised relatively high. This facilitates high precision digital-to-analog conversion and reduces the amplitude of what is called a glitch, that is, a spike-shaped noise which occurs when input digital signals are changed over.

Incidentally, the linearity of the conversion characteristic of this kind of D/A converter is dependent on the current ratios of current sources relative to one another. For high precision D/A conversion, a complex, highly accurate additional adjusting circuit is needed and, upon each occurrence of an ambient temperature change or secular change, time-consuming readjustment is required, resulting in increased maintenance costs.

in this prior art D/A converter, the code converting section 12 is constructed on a wired-logic basis and the relationship between the input high-order bits $B_1$ to $B_4$ of the digital input and the selected output terminals for providing outputs is initially fixed as shown in FIG. 3 and cannot be changed. In connection with the current values $I_1$ to $I_k$ of the constant-current sources $2_1$ to $2_k$, their errors can be reduced more easily than in the case of binary-weighting them, but the current value of each constant-current source may still contain some errors. This introduces the likelihood of error variations such that the error of the converter output is markedly large for a certain input digital signal but small for another input digital signal.

Let it be assumed, for example, that the error for each of the current values of the constant-current sources $2_1$ to $2_8$ is $+\alpha$ and that the error for each of the current values of the constant-current sources $2_9$ to $2_{15}$ is $-\alpha$ as shown in FIG. 4A. In this case, the error of the converted output for the digital input of the high-order bits $B_1$ to $B_4$ is 0 when the input high-order bits $B_1$, $B_2$, $B_3$ and $B_4$ are "1110", when the bits $B_1$, $B_2$, $B_3$ and $B_4$ are "0111", the error is $-7\alpha$ as shown in FIG. 4B. In this way, the conversion errors undergo substantial changes in accordance with the values of the input high-order bits. In this example, the error is large for input digital values close to the value "1000", and the error decreases as the input digital value approaches "0001" or "1111" from "1000".

Figure 5:
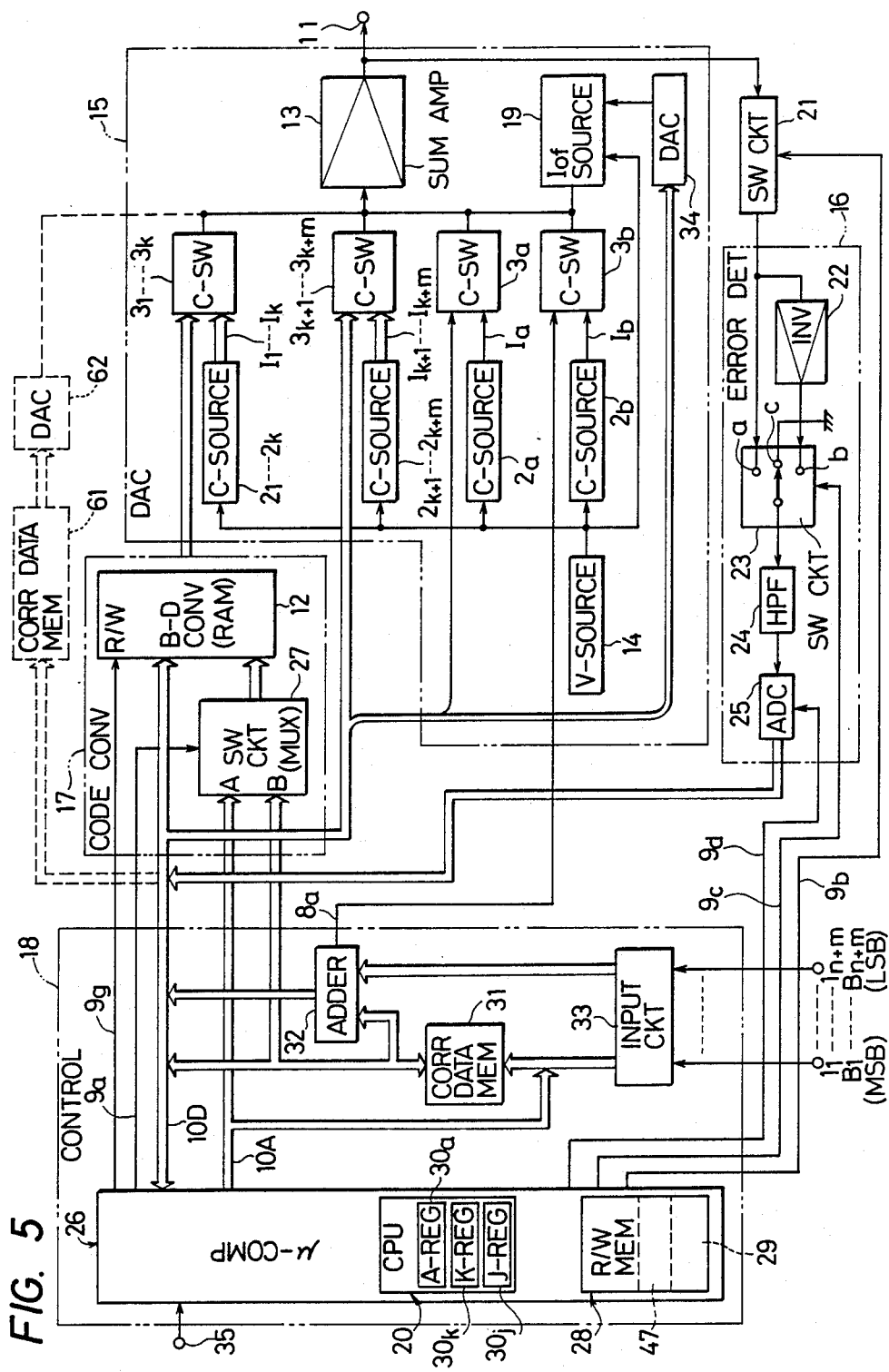
FIG. 5 is a block diagram illustrating an example of the D/A converting apparatus of the present invention

FIG. 5 illustrates an embodiment of the present invention, in which the parts corresponding to those in FIG. 1 are identified by the same reference numerals. The arrangement of this embodiment is divided into four main blocks, i.e. a D/A converting section 15 for converting an error-corrected signal into a corresponding analog voltage, an error detecting section 16 for detecting an error component of each current source form a voltage derived at the output terminal 11 during an automatic calibrating operation, a code converting section 17 and a digital controller 18 for computing error-corrected data, for controlling the respective parts in the apparatus and so forth.

A detailed description will be given of each part of the illustrated arrangement. The D/A converting section 15 includes current sources similar to those $2_1$ to $2_k$ and $2_{k+1}$ to $2_{k+m}$ used in FIG. 1, correcting current sources $2a$ and $2b$ and an offset current source 19 for setting up a range of converted outputs with any polarity. The D/A converting section 15 is basically the same as that shown in FIG. 1. The correcting current sources $2a$ and $2b$ are to make a positive correction for correcting an error that cannot be fully covered by a digital correcting operation, and these current sources output currents Ia and Ib, respectively. The currents Ia and Ib of the current sources $2a$ and $2b$ are selectively controlled by current switches $3a$ and $3b$ for input to a summing amplifier 13.

During automatic calibration a switching circuit 21 is turned ON, through which the analog output at the output terminal 11 is applied to the error detecting section 16. The switching circuit 21 is held in the OFF state during normal D/A converting operation. According to the type of an instrument connected to the output terminal 11, the switching circuit 21 may be dispensed with and the output terminal 11 is then connected directly to the error detecting section 16. The output of the switching circuit 21 is provided to an inverting amplifier of unity gain and a switching circuit 23. The switching circuit 23 selects one of its two inputs and supplies the selected input to a high-pass filter 24 or shorts its input side to ground potential. The output of the high-pass filter 24 is converted by an A/D converter 25 into a digital signal, which is provided to a microcomputer 26 of the digital controller 18.

The code converting section 17 comprises a binary-decimal code converter 12 and a switching circuit 27 which selectively supplies the code converter 12 with a specification code sent from the microcomputer 26 during automatic calibration and a specification code sent during normal operation of a D/A converter, e.g. The high-order bits $B_1$ to $B_4$.

In the digital controller 18, for example, the microcomputer 26 performs control of the procedure of automatic calibration, an operation for computing error correction values, control of bus lines, control of each switching circuit and so forth. The control procedures are stored in a program memory in the microcomputer 26 (not shown). the detected error values are once stored in a storage area of a read-write memory 28 and, on the basis of the stored error values, corrected values respectively corresponding to all the possible bit patterns of the high-order bits $B_1$ to $B_n$ of the digital inputs are obtained by computation. The corrected values thus obtained have the same bit length as that of the input digital signals, i.e. (n+m) bits, and are stored in a corrected data memory 31. The lower-order data $B_{n+1}$ to $B_{n+m}$ in a corrected value read out from the corrected data memory 31 and the lower-order bits $B_{n+1}$ to $B_{n+m}$ of the digital input are added by an adder 32. The digital input signals at the input terminals $1_1$ to $1_{n+m}$ are input via a digital input circuit 33.

All the current sources $2_1$ to $2_{k+m}$ may provide output currents of the same polarity, so that the summing amplifier 13 yields an output of one polarity, for instance, a positive voltage. In order to obtain converted outputs of both polarities, the offset current source 19 is provided which yields a negative voltage at the output of the summing amplifier 13. Also, in the present invention, the offset current source 19 is used when performing automatic calibration. An output offset current value $I_{of}$ of the offset current source 19 is determined by the output of a correcting D/A converter 34, and hence can be altered as required.

Figures 6A, 6B, 10A, 10B, 10C, 10D:
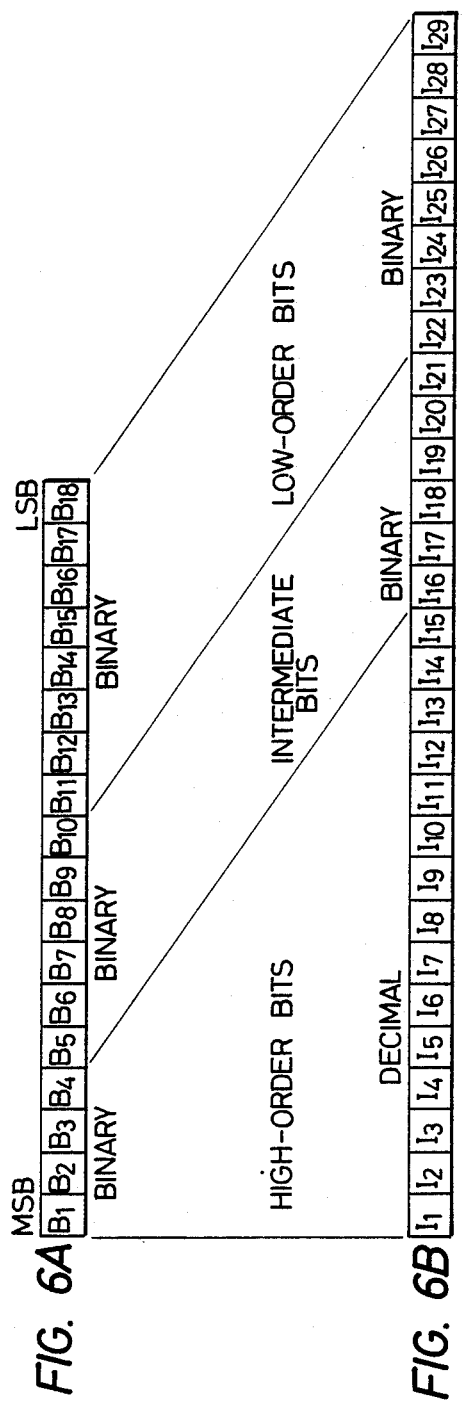
FIGS. 6A and 6B are diagrams showing the relationship between each bit of the input digital signal and the current of each current source.
FIGS. 10A to 10D are diagrams showing an example of the relationship between current source selection and timing during detection of an error in each high-order bit current source (a second step)

Let it be assumed that a binary input digital signal to be D/A converted is, for example, of 18-bit length, i.e. $B_1$ to $B_{18}$ as shown in FIG. 6A and that n=4, m=14 and k=15. The four high-order bits $B_1$ to $B_4$ are converted by the code converter 12 into the respective individual signals and, as shown in FIG. 6B, one or more of the currents $I_1$ to $I_{15}$ of equal weight are output in the same manner as described previously in respect of FIG. 2, and the intermediate bits $B_5$ to $B_{18}$ each output a corresponding binary-weighted current $I_{16}$ to $I_{29}$ l. The bits $B1$ to $B_{10}$ corresponding to the currents $I_1$ to $I_{21}$ are objects to be corrected and the currents $I_{22}$ to $I_{29}$ correspondingly to the low-order bits $B_{11}$ to $B_{18}$ are sufficiently linear and need not be corrected. Hereinafter, the bits $B_1$ to $B_{10}$ may also be called correction bits.

In the case where the converter shown in FIG. 5 is in the state of performing D/A conversion and the respective bits (binary) $B_1$ to $B_{18}$ of a digital input signal are applied to the digital signal input terminals $1_1$ to $1_{18}$, they are separated by the input circuit 33 into higher-order bits to be corrected i.e. correction bits $B_1$ to $B_{10}$ and low-order bits $B_{11}$ to $B_{18}$ not to be corrected, which are provided to the corrected data memory 31 and the adder 32, respectively. The corrected data memory 31 is addressed by the correction bits $B_1$ to $B_{10}$ to read out therefrom 18-bit data (corrected value). Of the 18 bits of the data thus read out, 10 higher-order bits $B_1$ to $B_{10}$ are used as substitutes for the 10 correction bits $B_1$ to $B_{10}$ provided to the digital signal input terminals $1_1$ to $1_{18}$, namely the four high-order bits $B_1$ to $B_4$ are applied via the switching circuit 27 to the code converter 12 and the six remaining bits $B_5$ to $B_{10}$ are provided via a data bus 10D to the intermediate current switches $3_{16}$ to $3_{21}$. The switching circuit 27 is controlled by the microcomputer 26 via a control line 9a so that during ordinary D/A converting operation it supplies the four-bit input signal i.e. $B_1$ to $B_4$ from the corrected data memory 31 to the code converter 12 and, during calibration operation, supplies the code converter 12 with a four-bit signal from the microcomputer 26 via an address bus 10A. The output of the code converter 12 is provided to the high-order current switches $3_1$ to $3_{15}$ (k=15) as in the case of FIG. 1.

The eight low-order bits $B_{11}$ to $B_{18}$ in the data read out from the corrected data memory 31 are applied as correction data to the adder 32. The adder 32 adds the low-order eight-bit correction data and the low-order eight-bit data $B_{11}$ to $B_{18}$ from the digital input circuit 33 and outputs final low-order data eventually corrected. The final low-order data $B_{11}$ to $B_{18}$ are provided via the data bus 10D to the low-order current switches $3_{22}$ to $3_{29}$. In the event that the result of the operation by the adder 32 exceeds the eight-bit length of the low order data, to cause a carryover of the range of digital correction, the adder 32 yields an overflow signal, which is applied via the signal line 8a to the positive correction bit switch $3b$, allowing the current Ib to be supplied to the summing amplifier 13 from the current source 2b. The current Ib is identical with the current $I_{21}$ corresponding to the least significant bit $B_{10}$ of the intermediate bits $B_5$ to $B_{10}$.

By the operation described above, there is derived at the analog output terminal 11 an analog signal having its linearity error corrected, corresponding to the digital input signals at the digital input terminals $1_1$ to $1_{18}$. The summing amplifier 13 at the final stage is a current-voltage converter which receives the high-order and low-order currents and correction bits currents and adds them together and then outputs the added result as a voltage.

Next, a description will be given of the automatic linearity calibration operation. The automatic calibration operation mentioned herein is confined to such a range in which relative errors of the respective current sources of the D/A converter are obtained and corrected values corresponding to high-order bits $B_1$ to $B_4$ of various input digital signals are obtained from the relative errors and stored in the corrected data memory 31. The automatic calibration operation starts with the application of an automatic calibration command signal to an input terminal 35. Upon starting the automatic calibration operation, the switching circuit 27 is changed over by the microcomputer 26 via the control line 9a to cut off the signal from the corrected data memory 31 and to supply the code converter 12 with the codes applied from the microcomputer 26 via the address bus 10A. The switching circuit 21 is also controlled by the microcomputer 26 via a control line 9b to be turned ON to input the output voltage at the analog output terminal 11 to the error detecting section 16. It is assumed that during the automatic calibration operation no input digital signals are applied to the digital signal input terminals $1_1$ to $1_{18}$.

The linearity error of the D/A converter is caused by the sum of relative current errors of its built-in current sources selected by the current switches. Therefore, in order to determine an error of each of the currents $I_1$ to $I_{21}$, it is necessary to selectively actuate the current switches $3_1$ to $3_{21}$, individually and/or in combination. This can be easily realized by arranging such that, for example, the code converter 12 is provided with another code conversion table which is different from that of FIG. 3 and which is accessed by the microcomputer 26 via the address bus 10A and the switching circuit 27 to read out codes for actuating desired ones of the current switches $3_1$ to $3_{15}$. The other current switches $3_{16}$ to $3_{21}$ can also be arbitrarily designated by the microcomputer 26 via the data bus 10D.

Figure 7:
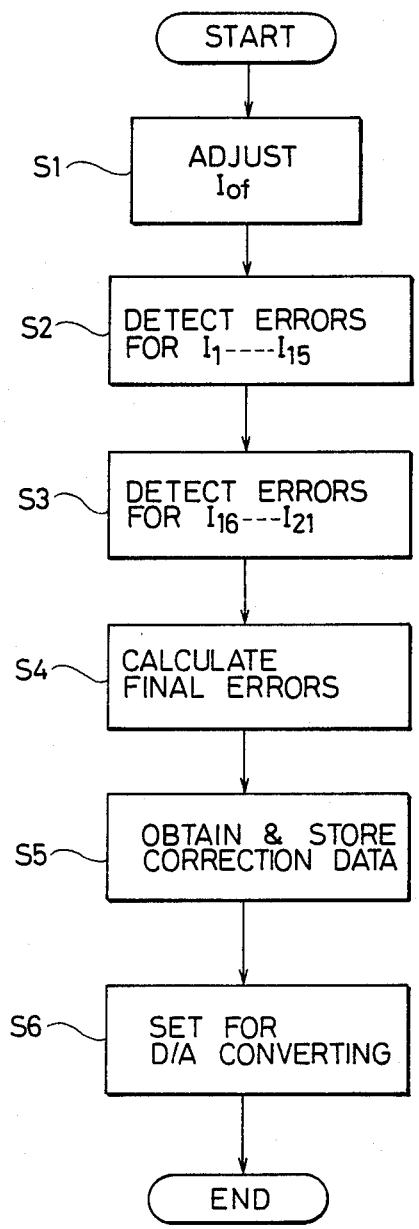
FIG. 7 is a flowchart showing an example of the operation of the apparatus of the present invention.

The automatic calibration takes place through the following first to fifth steps as shown in FIG. 7.

First step S1

The current $I_{of}$ of the offset current source 19 and eight currents, e.g. $I_1$ to $I_8$, selected from the high-order bit current sources $2_1$ to $2_{15}$, are output, and the current $I_{of}$ of the offset current source 19 is adjusted so that the output at the output terminal 11 may be zero.

Second step S2

A relative error of each current of the high-order bit current sources $2_1$ to $2_{15}$ corresponding to the four high-order bits $B_1$ to $B_4$ is detected on the basis of one of their current values.

Third step S3

A relative error of each current of the intermediate bit current sources $2_{16}$ to $2_{21}$ corresponding to the intermediate bits $B_5$ to $B_{10}$ is detected on the basis of one of the current values of the high-order bit current sources $2_1$ to $2_{15}$. In this case, the eight low-order bit currents $I_{22}$ to $I_{29}$ are assumed to have sufficient linearity and are not subjected to error detection.

Fourth step S4

The relative errors thus obtained are subjected to necessary operations to compute final error values of the respective bit currents, which are stored in the error storage area 29 in FIG. 5.

FIfth step S5

Corrected data is prepared on the basis of the data stored in the error storage area 29 and stored in the corrected data memory 31.

Sixth step S6

The automatic calibration operation ends with setting of the respective parts in condition for the D/A converting operation.

Figure 8:
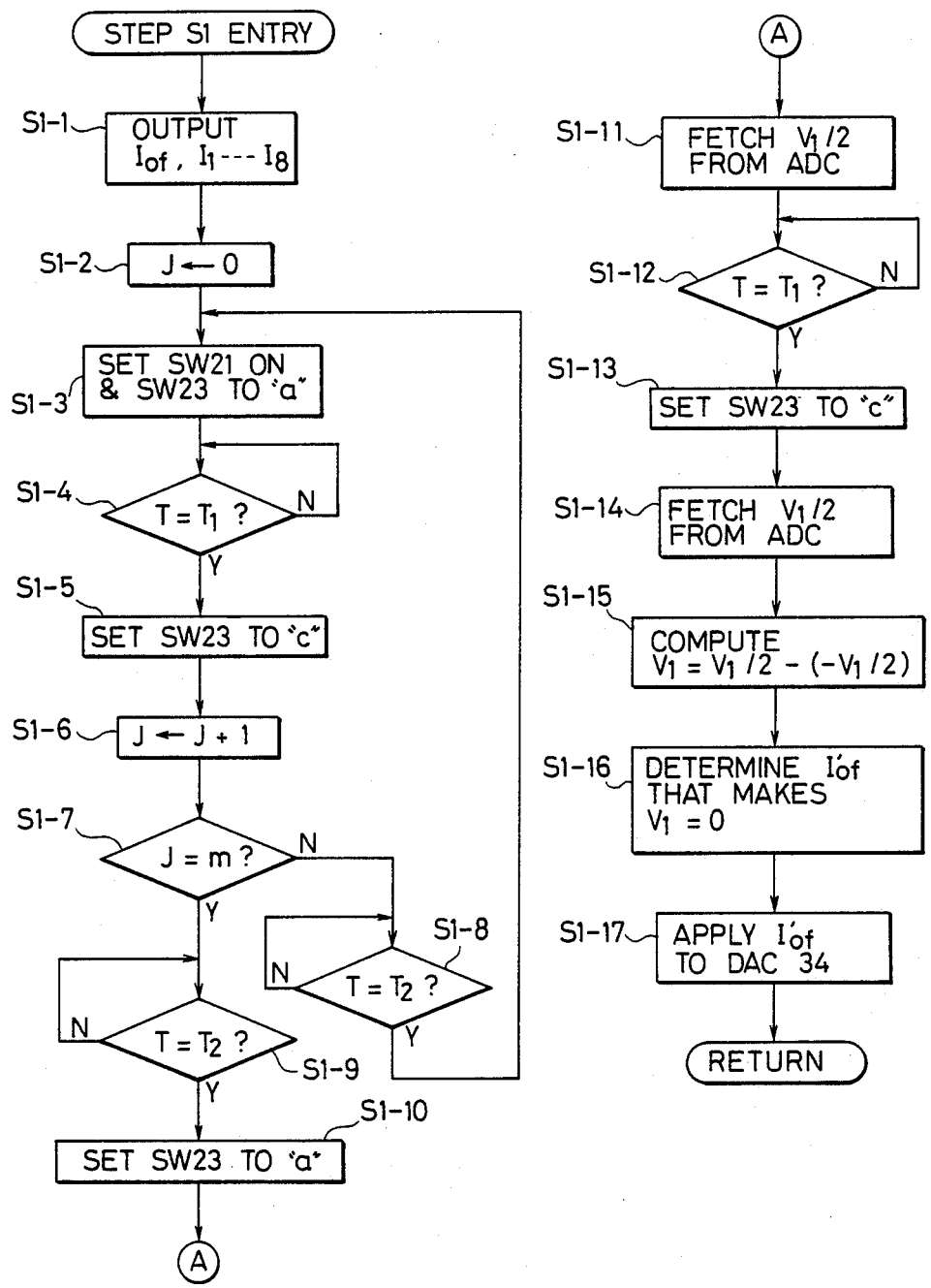
FIG. 8 is a flowchart showing an example of the operation of the converting apparatus of the present invention during adjustment of the offset current (a first step)

The first step S1 starts with calibration of the offset current source 1. The first step S1 is detailed as shown in FIG. 8, wherein; in step S1-1 a suitable data is supplied to the D/A converter 34 to produce an offset current $I_{of}$ of a suitable value from the offset current source 19, while at the same time eight current switches, for example, 3hd 1 to $3_8$ corresponding to the currents $I_1$ to $I_8$, are turned ON; a 0 is set in a J register $30j$ in the central processor (CPU) 20 of the microcomputer 26 in step S1-2; n step S1-3, the switching circuit 21 is turned ON by a control signal on the control line $9b$ and the switching circuit 23 is set to the side "a", that is, to the side of the switching circuit 21 by a control signal on a control line $9c$, thereby producing a voltage $V_1$ corresponding to $I_1+I_2+\ldots+I_8+I_{of}$ in the period $T_1$ shown in FIG. 9A and the output signal $V_1$ of the switching circuit 21 is provided to the high-pass filter 24; in step S1-4, the lapse of time $T_1$ is checked; after the elapsed time $T_1$, the operation proceeds to step S1-5, in which the switching circuit 23 is set to the side "c" to short the input side of the high-pass filter 24 to a zero potential, starting the period $T_2$; in step S1-6, the content of the J register $30j$ is incremented by one; in step S1-7, it is checked whether the incremented content of the J register $30j$ has become m (where m is an integer equal to or larger than one); if $J \neq m$, the operation proceeds to step S1-8, in which the lapse of time $T_2$ is checked; and after the elapsed time $T_2$, the operation is returned to step S1-3. When the content of the J register $30j$ is equal to m in step S1-7, the operation proceeds to step S1-9, in which it is checked whether the time $T_2$ has elapsed; after the elapsed time $T_2$, the switching circuit 23 is set to the side "a", that is, to the output side of the switching circuit 21 in step S1-10 and the period $T_1$ is initiated, supplying the voltage $V_1$ corresponding to the sum of the currents $I_1$ to $I_8$ and $I_{of}$ to the high-pass filter 24; in step S1-11, a conversion command is applied to the A/D converter 25 from the microcomputer 26 via a control line $9d$ and the digital value of the voltage $V_1/2$ provided at the output of the converter 25 at that time is fetched into the microcomputer 26; in step S1-12, it is checked whether the period $T_1$ has passed; after the elapsed time $T_1$, in step S1-13, the switching circuit 23 is set to the side "c" to ground the input side of the high-pass filter 24, initiating the period $T_2$; in step S1-14, a conversion command is applied to the A/D converter 25 and the digital value of its output voltage $-V_1/2$ is fetched into the microcomputer 26; in step S1-15, the microcomputer 26 computes a difference $V_1$ between the digital values $V_1/2$ and $-V_1/2$ fetched thereinto in steps S1-11 and S1-14; in step S1-16 the microcomputer 26 computes from the difference $V_1$ such an offset current $I_{of}'$ which may satisfy that the sum of the offset current $I_{of}'$ and the currents $I_1$ to $I_8$ becomes zero, and computes corrected data corresponding to this offset current $I_{of}'$; and, in step S1-17, sets the corrected data in the correcting D/A converter 34 via the data bus 10D.

Figure 9A:
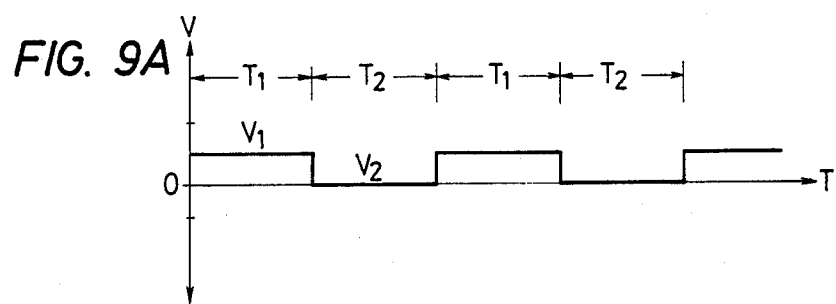
FIGS. 9A and 9B are timing charts showing examples of voltages produced at the input and the output side of a high-pass filter 24 during the offset current adjustment.
Figure 9B:
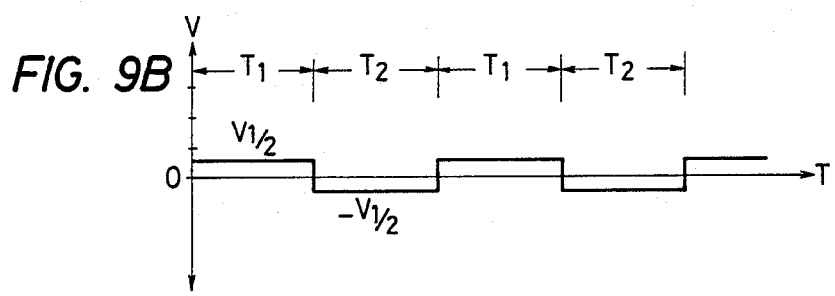

In the foregoing, the current $I_{of}$ and the currents $I_1$ to $I_8$ have different polarities and if the current $I_{of}$ and the sum of the currents $I_1$ to $I_8$ have the same absolute value, then the output at the output terminal 11 based on the sum of their values will become zero volts. In the case where these absolute values differ, a voltage $V_1$ is output for the period $T_1$ and $V_2$, which is zero volts, is output for the period $T_2$ as shown in FIG. 9A and, at the output of the high-pass filter 24, the DC component is cut off, providing a voltage $V_1/2$ for the period $T_1$ and $-V_1/2$ for the period $T_2$ as shown in FIG. 9B. In this case, $T_1 = T_2$. The value of m in step S1-7 is necessary for the output of the high-pass filter 24 to become steady-state and, as described later, when no filter is used, the value of m may also be one. By the output of the correcting D/A converter 34, the output offset current $I_{of}$ of the offset current source 19 is corrected and the sum of the current $I_{of}$ and the currents $I_1$ to $I_8$ becomes zero, completing the processing of the first step S1. Incidentally, since the input side of the high-pass filter 24 is grounded in the period $T_2$, the selection of each current source need not be limited specifically to the abovementioned example but may also be effected arbitrarily.

In the first step S1 the output of the switching circuit 23 can also be provided directly to the A/D converter 25. In this case, the period $T_2$ is unnecessary and the same correction as described above is carried out by reading out the output in the period $T_1$. Let it be assumed that the A/D converter 25 has no offset voltage in this case. Also it is possible to perform the calibration of the offset current $I_{of}$ in the time interval between the second and third steps $S_2$ and $S_3$.

In the second step S2, as described previously, an error of each of the currents $I_1$ to $I_{15}$ of the high-order current sources $2_1$ to $2_{15}$ shown in FIG. 6B is detected relatively to one of the currents. As depicted in FIGS. 6A and 6B, the four high-order bits $B_1$ to $B_4$ on the side of the most significant bit in the input digital signal are converted by the converter 12 to decimal form. Accordingly, in this example, the currents $I_1$ to $I_{15}$ of the constant-current sources $2_1$ to $2_{15}$ have the same weight; namely, they are generated by current sources of the same current value. In this case, the relative errors of the equally weighted currents $I_1$ to $I_{15}$ are detected on the basis of one of them. The switching circuit 23 in FIG. 5 is connected to the side "a" so that it passes therethrough the output of the switching circuit 21 to the high-pass filter 24.

Figure 11A:
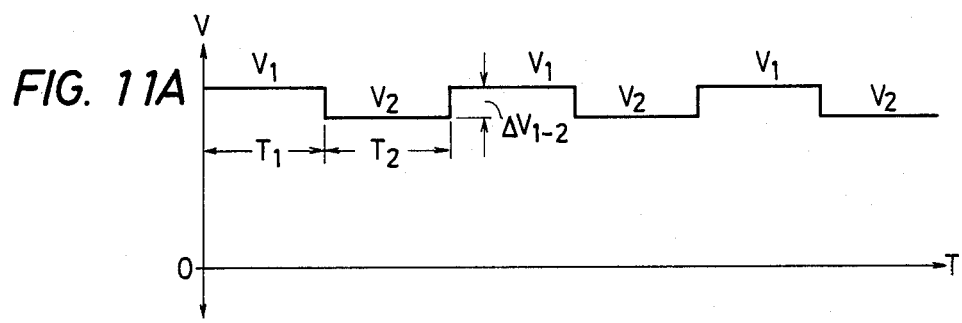
FIGS. 11A and 11B are timing charts showing examples of voltages yielded at the input and the output side of the high-pass filter 24 during detection of an error of each high-order current source.

In this example, the relative error of each of the currents $I_1$ to $I_{14}$ is detected on the basis of the current $I_{15}$ of the current source $2_{15}$. However, any one of the other currents $I_1$ to $I_{14}$ can also be used as the reference current. FIG. 10A shows selection and nonselection of the current sources in the periods $T_1$ and $T_2$ in the case of obtaining an error of the current $I_1$ on the basis of the current $I_{15}$. The current sources $2_{10}$ to $2_{29}$ are nonselected for both periods $T_1$ and $T_2$. FIG. 11A shows an example of potential variations at the analog output terminal 11 in the periods $T_1$ and $T_2$, and FIG. 11B the output status of the high-pass filter 24 in this case. Eight currents, in addition to the current $I_{of}$, are output in each of the periods $T_1$ and $T_2$. That is, the sum total of the values of eight of the currents $I_1$ to $I_{15}$ is approximately equal to the offset current $I_{of}$ of reverse polarity, so that the voltage level during the error detection can be obtained in the vicinity of zero potential. This allows the A/D converter 25 to have a narrow input range, which is advantageous for designing the response speed of the error detecting circuitry equipped with dynamic response. In this system using the error detection method in accordance with FIGS. 10A to 10D, the high-pass filter 24 may also be dispensed with.

Figure 11B:
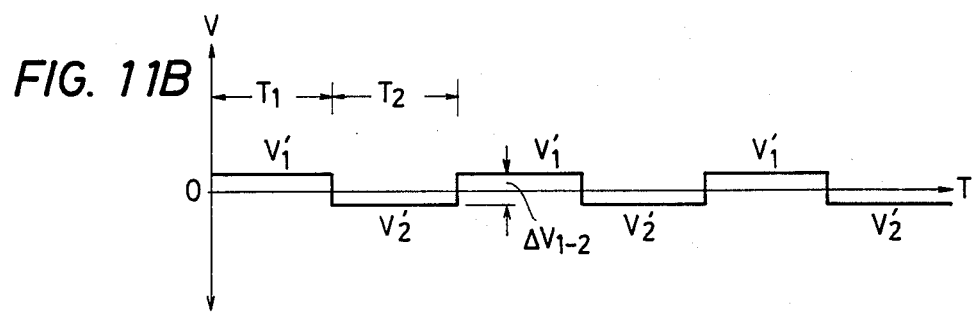

Since the offset current $I_{of}$ has been adjusted in step S1, in the case of detecting relative errors of the respective currents $I_1$ (see FIG. 10A) through $I_8$ (see FIG. 10B) the outputs $V_2$ at the terminal 11 are substantially zero volts in the respective periods $T_2$; however, when detecting an error in each of the currents $I_9$ (see FIG. 10C) through $I_{14}$ (see FIG. 10D), the output $V_2$ is not necessarily zero volts. The output of such a waveform as shown in FIG. 11A is supplied via the switching circuits 21 and 23 to the high-pass filter 24. The output of the high-pass filter 25 is applied to the A/D converter 25 while being retained at a potential $\Delta V_{1-2} = V_1 - V_2$ as shown in FIG. 11B. The A/D converter 25 converts the potentials of filter outputs $V_1'$ and $V_2'$ in the periods $T_1$ and $T_2$ into digital values for input to the microcomputer 26. The microcomputer 26 obtains, by computation, the value $\Delta V_{1-2}$ corresponding to the deviation of the current $I_1$ detected on the basis of the current $I_{15}$ and this value is stored as the error value of the current $I_1$ in the error storage area 29 of the memory 28 of the microcomputer 26.

Figure 12:
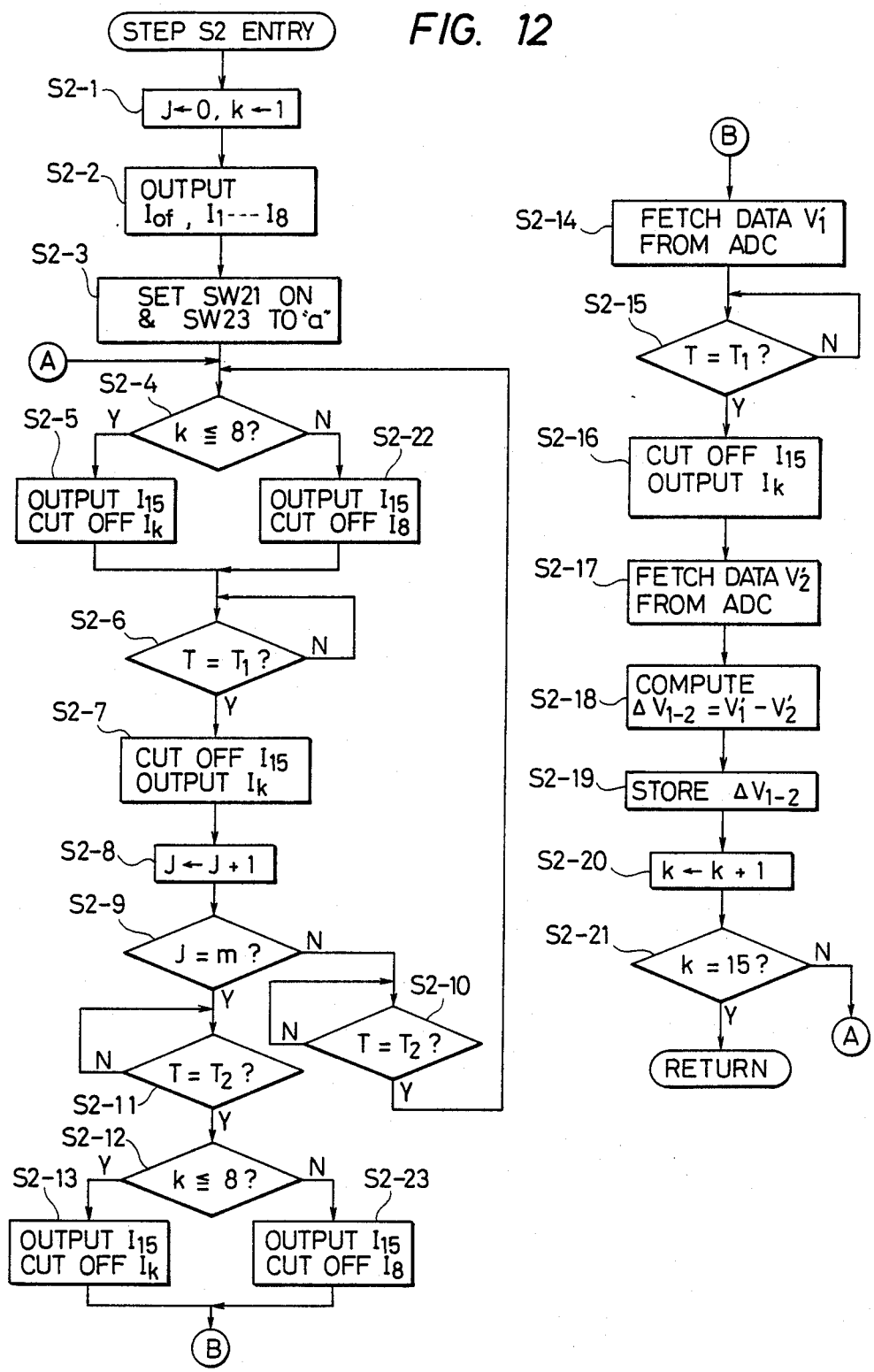
FIG. 12 is a flowchart illustrating an example of the operation during detection of the current error of each high-order bit current source.

A description will be given, with reference to FIG. 12, of an example of the procedure of processing of the second step S2. In step S2-1, the contents J and K of the J register 30$j$ and a K register 30$k$ in the CPU 20 are set to 0 and 1, respectively. In step S2-2, the current switches $3_1$ to $3_8$ are turned ON to output the currents $I_1$ to $I_8$. In step S2-3, the switching circuit 21 is turned ON and the switching circuit 23 is set to the side "a". In step S2-4, it is checked whether the content k of the K register 30$k$ is smaller than or equal to 8 and, if so, the operation proceeds to step S2-5, in which the current $I_{15}$ is output and a current $I_k$ (i.e. $I_1$ since k=1 in this case) is cut off and the period $T_1$ is started. When it is decided in step S2-6 that the period $T_1$ has passed, the current $I_{15}$ is cut off and the current $I_k$ ($I_1$ in this case) is output in step S2-7, starting the period $T_2$. In step S2-8, the content J of the J register 30$j$ is incremented by one and, in step S2-9, it is checked whether the content J has become equal to m and, if the content J is smaller than m, the end of the period $T_2$ is decided in step S2-10 and the operation returns to step S2-4.

In the case where it is decided in step S2-9 that the content J is equal to m, the operation proceeds to step S2-11, in which it is decided whether the period $T_2$ has elapsed. If so, it is checked in step S2-12 whether k≦8 and, if so, the operation proceeds to step S2-13, in which the current $I_{15}$ is output and the current $I_k$ (k is still one) is cut off, starting the period $T_1$. At a suitable moment in the period $T_1$ the output $V_1'$ of the high-pass filter 24 is converted by the A/D converter 25 into a digital value for input into the microcomputer 26 in step S2-14. When the end of the period $T_1$ is decided in step S2-15, the operation proceeds to step S2-16, in which the current $I_{15}$ is cut off and the current $I_k$ is output, starting the period $T_2$. At a proper moment in the period $T_2$ in step S2-17, the output $V_2'$ of the high-pass filter 24 is converted by the A/D converter 25 into digital form for input into the microcomputer 26. In step S2-18, the difference, $\Delta V_{1-2}$, between the digital values $V_1'$ and $V_2'$ which have been fetched into the microcomputer 26 in steps S2-14 and S2-17 is computed and, in step S2-19, the difference $\Delta V_{1-2}$ is stored in the error storage area 29. In step S2-20, the content K of the K register 30$k$ is incremented by one and it is checked in step S2-21 whether the content K has reached 15 and, if it is smaller than 15, the operation proceeds to step S2-4, thereby to start the error detection for the current $I_k = I_2$. At this time, as shown in FIG. 10B, the currents $I_{of}$, $I_1$ and $I_3$ to $I_8$ and $I_{15}$ are output in the period $T_1$ and, in the period $T_2$, the currents $I_{of}$ and $I_1$ to $I_8$ are output. In this case where the content K of the K register 30$k$ is 9 or more, for instance, where K=9, the operation proceeds to step S2-22, in which the current $I_{15}$ is output and the current $I_8$ is cut off, starting the period $T_1$, and the operation proceeds to step S2-6 and steps S2-7 through S2-11 are carried out in the same manner as in the case of K≦8. Following step S2-11, it is decided in step S2-12 that the content K of the K register 30$k$ is not equal to or smaller than 8, and the operation proceeds to step S3-23, in which the current $I_{15}$ is output and the current $I_8$ is cut off, which is followed by step S2-14. The subsequent steps are similarly carried out. When errors of the currents $I_1$ to $I_{14}$ have thus been detected, it is decided in step S2-21 that the content K of the K register 30$k$ is equal to 15, and the processing of the second step S2 is completed.

In FIGS. 11A and 11B, the periods $T_1$ and $T_2$ are shown to repeat, but it is also possible to put an end to them after one cycle, and to shift to the error detection for the next current source. This also applies to the first step S1.

In the third step S3 of FIG. 7 the error detection is carried out for the currents $I_{16}$ to $I_{21}$ of the current source $2_{16}$ to $2_{21}$ corresponding to the binary intermediate bits $B_5$ to $B_{10}$ in FIG. 6A. The switching circuit 23 in FIG. 5 is changed over to supply the output of the switching circuit 21 to the high-pass filter 24 in the period $T_1$ and the output of the inverting amplifier 22 in the period $T_2$. At first, the error detection for the current $I_{16}$ takes place. The current $I_{16}$ has a value approximately one half the value of any one of the currents $I_1$ to $I_{15}$ corresponding to the respective outputs of the code converter 12, and the error of the current $I_{16}$ is detected relative to one of the high-order bit current sources $2_1$ to $2_1$. In this case, the relative error of the current $I_{16}$ is detected first in reference to the current $I_8$ and then the relative error of the current $I_{17}$ is detected in reference to the current $I_8$, and so on; thus, the relative errors of the currents $I_{16}$ to $I_{21}$ are detected in successive order. The error of the current $I_8$ is already detected by the error detection of the high-order bit current sources.

A description will be given first of the procedure for detecting the error of the current $I_{16}$ relative to the current $I_8$. FIG. 13A shows the timings and the selection of the current sources. The currents $I_9$ to $I_{15}$ and $I_{22}$ to $I_{29}$ are cut off at all times. In the period $T_1$ the currents $I_{of}$ and $I_1$ to $I_8$ and, further, $I_{16}$ the error of which is to be detected, are output. Since the current $I_{of}$ has been calibrated in the first step S1, the sum of the currents $I_{of}$ and $I_1$ to $I_8$ is zero. Consequently, the output in the period $T_1$ is the current $I_{16}$ alone ($V_{11}$ in FIG. 14A).

In the period $T_2$ the current $I_8$ is cut off (see FIG. 13A) and the currents $I_{of}$, $I_1$ to $I_7$ and $I_{16}$ are added together, producing at the analog output terminal 11 a voltage $V_{b1}$ in FIG. 14A. In FIG. 14A, $V_{a1}$ is the output potential level at the output terminal 11 when the current $(I_{of}+I_1+I_2+\ldots+I_8)-I_8$ is supplied to the summing amplifier 13. The potential level $V_{b1}$ is polarity inverted by the inverting amplifier 22 into $V_{21}$. The voltage $V_{11}$ corresponds to the current $I_{16}$, $V_{a1}$ corresponds to $-I_8$, $V_{b1}$ corresponds to $-I_8+I_{16}$ and $\Delta V = V_{11}-V_{21}$ corresponds to $I_{16}-(I_8-I_{16})$, i.e. $2I_{16}-I_8$. In other words, $\Delta V$ indicate a value twice as large as the error value of the current $I_{16}$ obtained on the basis of the current $I_8$, and the output $\Delta V/2$ (in FIG. 14B) of the high-pass filter 24 becomes the relative error i.e. $I_{16}-I_8/2$. The A/D converter 25 detects the filter outputs $V_{11}'$ and $V_{21}'$ yielded in the periods $T_1$ and $T_2$, respectively, and provides them to the microcomputer 26, in which an error of the current $I_{16}$ is obtained by computation and the computation result is stored in the error storage area 29. FIG. 14C shows the potential at the analog output terminal in the case where the currents $I_8$ and $I_{16}$ are exactly in the ratio of 2:1. In this case, the output of the high-pass filter 24 becomes zero potential, resulting in no error in the current $I_{16}$ relative to the current $I_8$.

Next, the error detection for the current $I_{17}$ is carried out. FIG. 13B shows the timing of this operation and the selection of the current sources. In the period $T_1$ the currents $I_{of}$, $I_1$ to $I_8$ and $I_{17}$ are output and in the period $T_2$ the currents $I_{of}$, $I_1$ to $I_7$, $I_{16}$ and $I_{17}$ are output. The potential detected at this time contains the value of the current $I_{16}$ but, since the current $I_{16}$ has already been subjected to the error detection, its error is known, so that the error of the current $I_{17}$ alone can be separated. The error thus obtained is similarly stored in the error storage area 29. FIG. 13C shows the timing for detecting an error of the current $I_{21}$ and the selection of the current sources therefor. In the period $T_1$ the currents $I_{of}$, $I_1$ to $I_8$ and $I_{21}$ are output and in the period $T_2$ the currents $I_{of}$, $I_1$ to $I_7$ and $I_{16}$ to $I_{21}$ are output. Furthermore, the currents $I_a$ and $I_b$ of the current sources 2a and 2b for the positive correction bits are also obtained following the above-described error detection procedure for the intermediate bits.

Figure 15:
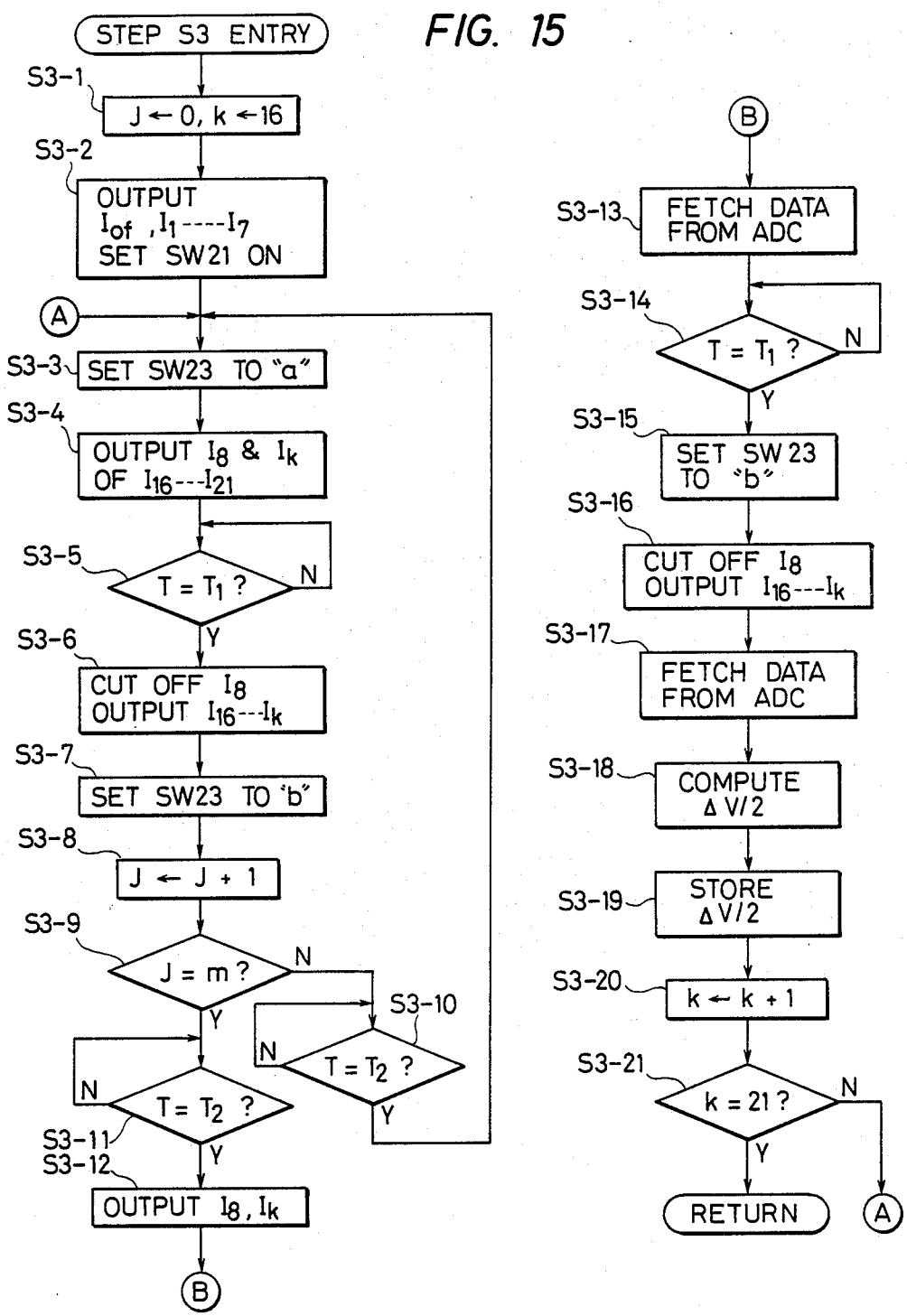
FIG. 15 is a flowchart illustrating an example of the operation during the current error detection of the intermediate bit currents (a third step)

The error detection processing procedure of step S3 in FIG. 7 for the currents $I_{16}$ to $I_{21}$ of the intermediate bits is substantially the same as the first and second steps S1 and S2, and it will be described briefly with reference to FIG. 15. In step S3-1 the contents of the J register 30j and the K register 30k are set to 0 and 16, respectively, and in step S3-2 the currents $I_{of}$ and $I_1$ to $I_7$ are output and the switching circuit 21 is turned ON. In step S3-3 the switching circuit 23 is connected to the side "a" and in step S3-4 the currents $I_8$ and $I_k$ ($=I_{16}$) are output. The currents $I_{16}$ to $I_{21}$ except for $I_k$ are held OFF. This is followed by the period $T_1$. In step S3-6 the current $I_8$ is cut off and the currents $I_{16}$ to $I_k$ are output (in this case, since k is still 16, $I_{16}$ is output), after which the period $T_2$ starts. In step S3-7 the switching circuit 23 is connected to the side "b" and the content J of the J register 30j is incremented by one in step S3-8 and, if the content J is not equal to m, the operation goes back to step S3-3 at the end of the period $T_2$. If J=m, the currents $I_8$ and $I_k$ are output upon completion of the period $T_2$ and the output of the high-pass filter 24 is input into the microcomputer 26 and, upon completion of the period $T_1$, the switching circuit 23 is set to the side "b" (step S3-15). In step S3-16 the current $I_8$ is cut off and the currents $I_{16}$ to $I_k$ are output and in step S3-17 the output of the high-pass filter 24 is input into the microcomputer 26, in which a difference between it and the value fetched in step S3-13 is obtained in step S3-18 and stored in the error storage area 29 in step S3-19. In step S3-20 the content K of the K register 30k is incremented by one and, if not K=21, then the operation returns to step S3-3. If K=21, the third step S3 is completed.

Incidentally, the processing of the first, second and third steps S1, S2 and S3 shown in FIGS. 8, 12 and 15, respectively, may be modified in part as follows: The operation may proceed from steps S1-6, S2-8 and S3-8 directly to steps S1-9, S2-11 and S3-11 without deciding in steps S1-7, S2-9 and S3-9 whether J=m; the subtraction in steps S1-15, S2-18 and S3-18 is carried out; it is decided whether J=m; if not J=m, the subtraction result is stored and the operation returns to steps S1-3, S2-4 and S3-3; and if J=m, the mean of the subtraction results obtained so far is obtained and stored as an error in the error storage area 29.

Also it is possible in the first, second and third steps S2, S2 and S3 that the outputs of the high-pass filter 24 obtained in respect of all the currents $I_1$ to $I_{21}$ before the subtracting operation are stored in the storage area 29, which is followed by the subtracting operations.

In the manner described above, relative errors of the currents $I_1$ to $I_{15}$ of the high-order bit current sources and the currents $I_{16}$ to $I_{21}$ of the intermediate bit current sources are detected and all stored in the error storage area 29.

Next, a description will be given of an example of the procedure for preparing corrected data from the data stored in the error storage area 29 and storing them in the corrected data storage circuit 31.

The data to be stored in the corrected data storage circuit 31 are 18-bit corrected data which can produce a correct converted analog output corresponding to the 10 high-order (MSB side) bits $B_1$ to $B_{10}$, and positive correction bit (Ia) data. In this example, the currents $I_{22}$ to $I_{29}$ for the eight low-order bits $B_{11}$ to $B_{18}$ in the D/A converting section 15 have sufficient linearity and need not be subjected to error correction; therefore, the corrected data is required for only the 10 high-order bits $B_1$ to $B_{10}$.

At first, the 10 high-order bits of the digital input are converted on the basis of their error data obtained by the error detecting operation so that the errors for all the respective current sources become negative. In this code conversion, if there is such a digital input that specifies a current source having a positive error, it is converted into a digital value of lower-order than the digital input and a combination which causes a negative error for the input is obtained and stored in the correction data storage circuit 31. For instance, in the case where a positive errors, 10 bits in which 1 is subtracted from the least significant bit of the 10 high-order bits of the input are stored in the correction data storage circuit 31. If the negative error thus obtained exceeds the low-order eight-bit data area, data which outputs the positive correction bit current source 2a for correcting it on an analog basis is prepared at the same time and stored in the correction data storage circuit 31. In this way, the data for correcting the 10 high-order bits are all within the eight-bit data area. The correction data are obtained by computation and stored in the corrected data storage circuit 31 and, during ordinary operation, they are referred to as integrated correction data. Accordingly, during ordinary operation the correction of an input digital signal can be achieved by only one readout operation of the correction data storage circuit 31 and the adding operation of the adder 32. This permits simplification of the control circuit (the microcomputer 26) and reduction of the corrected data transfer time. Since all the errors are made to become negative, the correction bit current sources for analog correction are all positive in polarity, so that their circuit arrangement and operation are both simple. Moreover, the adder 32 is required to perform only an adding operation; namely, no subtracting operation is needed. While in the above the correction is described to be performed using the positive correction bit current sources alone, it is also possible to carry out the correction using positive and negative correction bits without involving the code conversion of high-order bits; furthermore, when the error range is narrow, the entire correction can also be effected without using the correction bits, i.e. on an analog basis.

Figure 16:
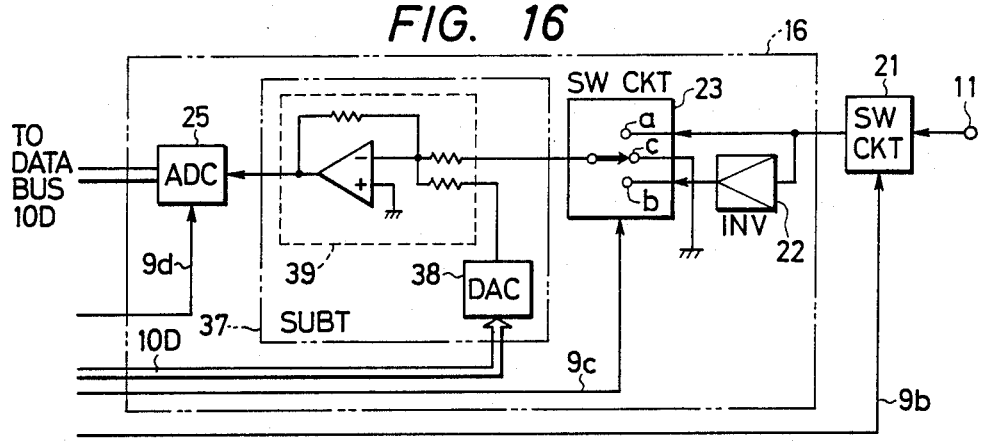
FIG. 16 is a circuit diagram illustrating another example of an error detecting section 16.

FIG. 16 illustrates another example of the error detecting section 16. In this example, a subtractor 37 is employed in place of the high-pass filter 24 in FIG. 5. That is, for the error detection for the currents $I_{16}$ to $I_{21}$ of the binary intermediate bits in the third step S3, the difference $\Delta V$ between the analog output voltages corresponding to the periods $T_1$ and $T_2$ is detected instead of measuring the absolute values of these analog output voltages. For such an arrangement, in the subtractor 37, a low resolution D/A converter 38 is provided, by the output of which a predetermined DC component corresponding to, for example, $-I_8/2$ is removed (subtracted) in an adder 39 from the outputs of the switching circuit 23 in the periods $T_1$ and $T_2$. As a result, the outputs of the subtractor 37 can be set within a narrow dynamic range in the vicinity of 0 [V], thereby retaining the voltage difference $\Delta V$ within the allowable input range of the A/D converter 25. The digital value corresponding to the current $-I_8/2$ is set in the D/A converter 38 from the microcomputer 26 via the data bus 10D. The input digital value of the D/A converter 38 is made variable by the microcomputer 26 as required. For instance, instead of controlling the current $I_{15}$ to output it or to cut it off in the second step S2, a value corresponding to the current $-I_{15}$ or zero is set in the D/A converter 38, by which errors of the currents $I_1$ to $I_{15}$ can be detected on the basis of the analog output corresponding to the current $-I_{15}$.

Figure 17:
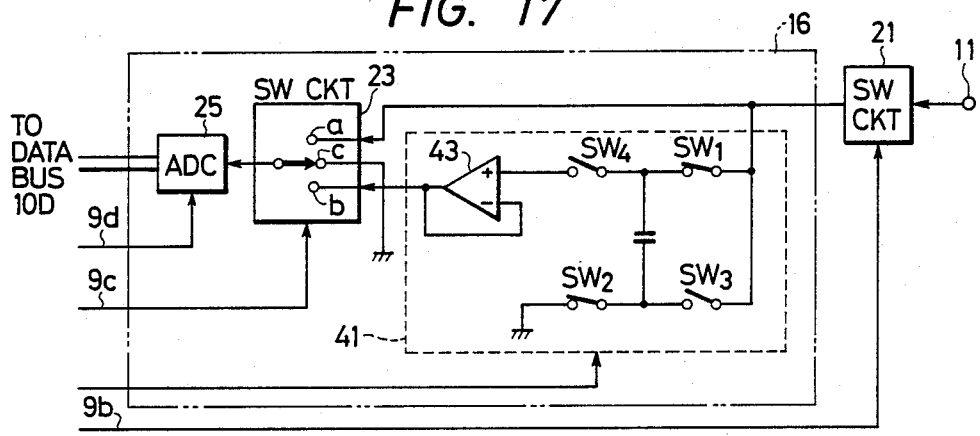
FIG. 17 is a circuit diagram illustrating another example of the error detecting section 16.

The error detecting section 16 may also be constructed as shown in FIG. 17, which employs a flying capacitor circuit 41 in place of the inverting amplifier 41 in FIG. 5 and dispenses with the high-pass filter 24. The circuit arrangement of FIG. 17 performs to directly detect the difference between $V_{11}$ and $V_{21}$ in the periods $T_1$ and $T_2$ in FIG. 14A in the error detection of the binary intermediate bit currents $I_{16}$ to $I_{21}$ in the third step S3. The output side of the flying capacitor circuit 41 is connected to the A/D converter 25. The current switching code patterns in the periods $T_1$ and $T_2$ are generated in the same manner as in the third step S3. In this case, switches $SW_1$ to $SW_4$ are controlled as follows: In synchronism with the timing of the periods $T_1$ and $T_2$ the switches $SW_1$ and $SW_2$ are turned ON and the switches $SW_3$ and $SW_4$ OFF at the start of the period $T_1$ and, at the start of the period $T_2$, the switches $SW_1$ and $SW_2$ are turned OFF and the switches $SW_3$ and $SW_4$ ON. In the period $T_1$ the voltage $V_{11}$ is applied to a capacitor 42 to charge it up to $V_{11}$ with respect to the ground potential and, in the period $T_2$, the grounding side of the capacitor 42 is floated by the turning OFF of the switch $SW_2$ and, at the same time, biased with the voltage $V_{b1}$ via the switch $SW_3$. Since $V_{b1}$ $= -V_{21}$ as shown in FIG. 14A, a potential $(V_{11}-V_{21})$ is produced and provided via an output buffer 43 to the switching circuit 23.

Figure 18:
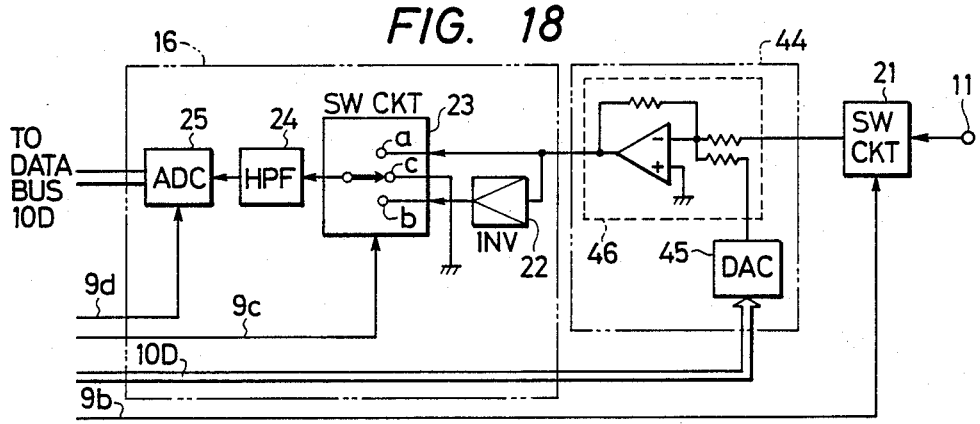
FIG. 18 is a circuit diagram illustrating an example in which a subtractor is provided at the input side of the error detecting section 16.

When implementing error detections in accordance with the procedures described, for example, with reference to FIGS. 10A to 10D and FIG. 11A, 11B, there may happen in some cases that a sum total of current errors in a selected combination of current sources becomes unexpectedly large, resulting in that the input to the A/D converter 25 during the periods $T_1$ and/or $T_2$ falls outside the conversion range of the A/D converter 25. In order to avoid this it is possible to connect a subtractor 44 to the input side of the error detecting section 16 as shown in FIG. 18. The arrangement of FIG. 18 is applied to the case where the input voltage to the A/D converter 25 falls outside its range of conversion in the first, second and third steps S1, S2 and S3. The output of a D/A converter 45, which has been calibrated with reference to one of the currents $I_1$ to $I_{21}$, is subtracted by an adder 46 from the output of the switching circuit 21 and the subtracted output is provided to the inverting amplifier 22 and the switching circuit 23. In the event that the A/D converter 25 is supplied with a voltage exceeding its range of conversion owing to a large error during error detection of each of the output currents $I_1$ to $I_{21}$, a suitable value is set in a D/A converter 45 via the data bus 10D from the microcomputer 26 during the period $T_1$ or $T_2$ so that the input voltage to the A/D converter 25 may fall inside its range of conversion. The converted output value of the A/D converter 25 and the set value of the D/A converter 45 are added together in the microcomputer 26 and the added value is handled as converted data of the A/D converter 25. In this way, the range of conversion of the A/D converter 25 an be effectively enlarged. In FIG. 18 the high-pass filter 24 may be substituted with the subtractor 37 shown in FIG. 16.

Figures 19, 24:
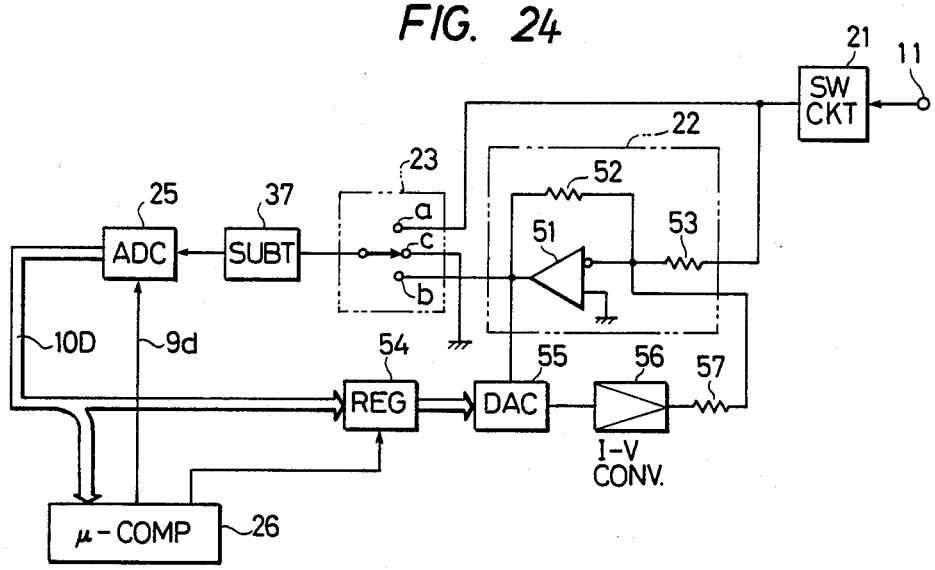
FIG. 19 is a block diagram illustrating an example in which the input/output relation of a code converting section is made changeable.
FIG. 24 is a circuit diagram illustrating an example in which automatic calibration is provided for the error of the inverting amplifier.

It is preferable to arrange the code converting section 1 so that its input and output can freely be changed. For instance, as illustrated in FIG. 19, a read/write memory is provided as the code converter 12, in which an address code ($B_1 ... B_n$) input thereto is decoded and any one of addresses $A_1$ and $A_k$ is selected. Each of the addresses $A_1$ to $A_k$ stores k bits $b_1$ to $b_k$ as shown in FIG. 19; namely, the read/write memory is a memory for k words each of k bits. When the selected address is read out, the contents of its k bits are provided as outputs $b_1$ to $b_k$, which are applied as control signals to the current switches $3_1$ to $3_k$, respectively.

Such an arrangement is made that a desired one of the current sources $2_1$ to $2_k$ is selected by the microcomputer 26 to supply its current to the output terminal 11. To this end, in the embodiment of FIG. 5, a multiplexer is provided as the switching circuit 27 at the input side of the code converter 12 and the multiplexer 27 is controlled by the microcomputer 26 via the control line 9a so that the high-order bits $B_1$ to $B_n$ in the output of the corrected data storage circuit 31 are selectively applied as the address code "$B_1 ... B_n$" to the code converter 12. Alternatively, data "$C_1 ... C_n$" is input into the multiplexer 27 via the address bus 10A from the microcomputer 26 and provided as the address code "$B_1 ... B_n$" via the multiplexer 27 to the code converter 12. Further, in this embodiment, a read/write control signal and write data "$D_1 ... D_k$" provided to the code converter 12 from the microcomputer 26 via a control line 9g and the data bus 10D, respectively, by which the data "$D_1 ... D_k$" is written in respective bits (memory cells)

$b_1$ to $b_k$ at a location specified by the address "$B_1 \ldots B_n$".

The write operation may also be carried out so that the high-order bit current sources $2_1$ to $2_k$ can be selected one by one. That is to say, in the case where the high-order bits to be converted by the code converter 12 are four bits $B_1$ to $B_4$ as in the aforementioned example, the data "$D_1 \ldots D_k$" is stored in one of the addresses $A_1$ to $A_{15}$ of the data converter 12 specified by the address code "$B_1 \ldots B_4$" in such a manner that only one bit, which differs with the addresses $A_1$ to $A_{15}$, represents a 1; for example, as shown in FIG. 20 in which only the bit $b_{15}$ goes to a 1 in the address $A_1$ and only the bit $b_{14}$ in the address $A_2$. The microcomputer 26 specifies these addresses via the address bus 10A and, at the same time, provides the corresponding data "$D_1 \ldots D_k$" via the data bus 10D to the code converter 12 for writing therein the data.

After this, the multiplexer 27 is held in the state in which to select the input thereto from the side "A" and the address data "$C_1 \ldots C_n$" is provided from the microcomputer 26 via the address bus 10A to the code converter 12 to read out the respective address. By the read-out output one of the high-order bit current sources $2_1$ to $2_{15}$ is selected and its current is output. In the error detecting section 16, the switching circuit 21 is turned ON to connect the switching circuit 23 to the side "a" and the output analog signal derived at the output terminal 11 is converted by the A/D converter 25 to a digital signal, the converted value of which is input via the data bus 10D into the microcomputer 26.

Figure 21:
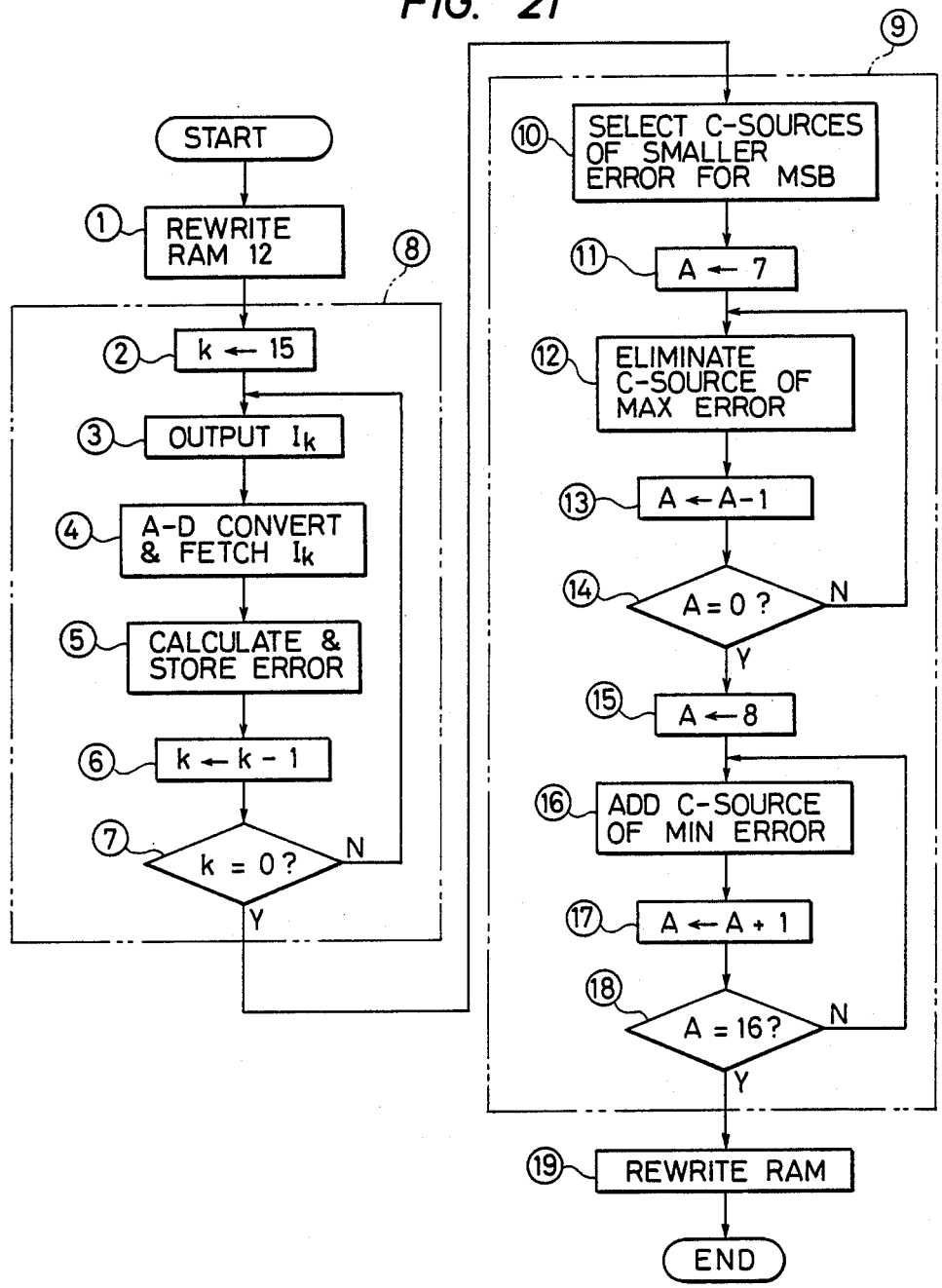
FIG. 21 is a flowchart illustrating an example of the procedure for error optimizing processing.

In this way, the high-order bit current sources $2_1$ to $2_k$ are selected one by one to detect their current values, their errors are detected and then the input/output relation of the code converter 12 is selected on the basis of the detected errors so that the error may be optimized. The processing therefor is called error optimizing processing. This error optimizing processing is carried out, for example, as shown in FIG. 21. In step ① the content of the code converter (RAM) 12 is rewritten by the microcomputer 26 as shown in FIG. 20. In step ② the content K of the K register 30k is made a 1, and in step ③ its content K is read out and the data "$C_1 \ldots C_n$" is applied as an address to the code converter 12 via the multiplexer 27. For instance, as in FIG. 20, an address 0001 is provided to turn ON the switch $3_k$ (k=15) alone, for outputting the current $I_k$ (step 3). In step ④ the current $I_k$ is input as a digital value into the microcomputer computer 26 via the A/D converter 25. In this case, it is preferable that a value corresponding to the correct current value of the high-order bit current source be set in the subtractor 37 using the embodiment of FIG. 16 and subtracted from the input thereto. An error of the digital value input into the microcomputer 26 is computed relative to a predetermined value, and in step ⑤ the error is stored in an error storage area 47 in the memory 28. In the next step ⑥, the content K of the K register 30k is decremented by one and it is checked in step ⑦ whether the new content K agrees with zero. If not, the operation goes back to step ③, in which the new content K of the K register 30k is output as the data "$C_1 \ldots C_n$" which is provided to the code converter 12. Thereafter the same operation is repeated. In the case where the new content K of the K register 30k coincides with zero in step ⑦, this current error detecting processing ⑧ is completed, which is followed by the error optimizing processing ⑨.

In the error optimizing processing ⑨, as an example, in step ⑩ the current source is selected that minimizes the error for the digital input when only the most significant one (MSB) of the four high-order bits $B_1$ to $B_4$ is a 1. Namely, for this case wherein the data 1000 is provided with only the most significant one ($B_1$) of the four high-order bits $B_1$ to $B_4$ made a 1, the errors of the high-order bit current sources $2_1$ to $2_{15}$ stored in the error storage area 47 are referred to and the eight current sources with the smallest errors are selected in a sequential order, starting with the current source of the smallest error. In this case, the combination of current sources is selected so that the sum total of the errors of the currents of the eight selected current sources is a minimum, with their polarity also taken into account. Let it be assumed, for example, that the current sources $2_1, 2_3, 2_5, 2_7, 2_9, 2_{11}, 2_{13}$ and $2_{15}$ have been selected corresponding to the data 1000 in step ⑩. Next, the content A of an A register 30a is set to 7 in step ⑪. In step ⑫, the current source with the largest error is removed from the eight selected current sources, and then an operation is performed so that the sum total of the errors of the currents of the seven remaining current sources is minimized. In step ⑬, the content A of the A register 30a is decremented by one. It is checked in step ⑭ whether the new content A of the A register 30a is 0. If it is not 0, the operation returns to step ⑫, in which the current source with the largest error is removed from the seven remaining current sources and an operation is carried out to minimise the sum of the errors of the six remaining current sources. Thereafter the same operation is repeated. In the case where it is decided in step ⑭ that the content A of the A register 30a is 0, the operation proceeds to step ⑮, in which the content A of the A register 30a is set to 8. This is followed by step ⑯, in which the current source of the smallest error among the seven remaining current sources is added to the eight current sources selected in step ⑩, and an operation is carried out that minimizes the error at that time. After this, the content A of the A register 30a is incremented by one in step ⑰. In step ⑱ it is checked whether the content A of the A register 30a has become 16. If it is not 16, the operation returns to step ⑯, in which a current source of the smallest error among the six remaining current sources is similarly added to the aforesaid nine current sources and an operation is performed so that the overall error is minimized. Thereafter, similar operations are carried out and when the content A of the A register 30a becomes 16, the error optimizing processing is completed, which is followed by step ⑲.

In step ⑲ the content of the code converter 12 is rewritten so that the eight current sources selected in step ⑩ corresponding to the bit pattern "1000" of the four high-order bits $B_1$ to $B_4$ are selected, to that the seventh, sixth, . . . current sources remaining after each step ⑫ are sequentially selected respectively corresponding to the bit patterns of the four high-order bits $B_1$ to $B_4$ resulting from successive subtraction of "1" from the data "1000", and so that the ninth, tenth, . . . current sources added one by one in step ⑯ are sequentially selected respectively corresponding to the bit patterns of the four high-order bits $B_1$ to $B_4$ resulting from successive addition of "1" to the data "1000". As a result of this, the stored contents of the code converter 12 are such, for instance, as shown in FIG. 22.

Figure 23:
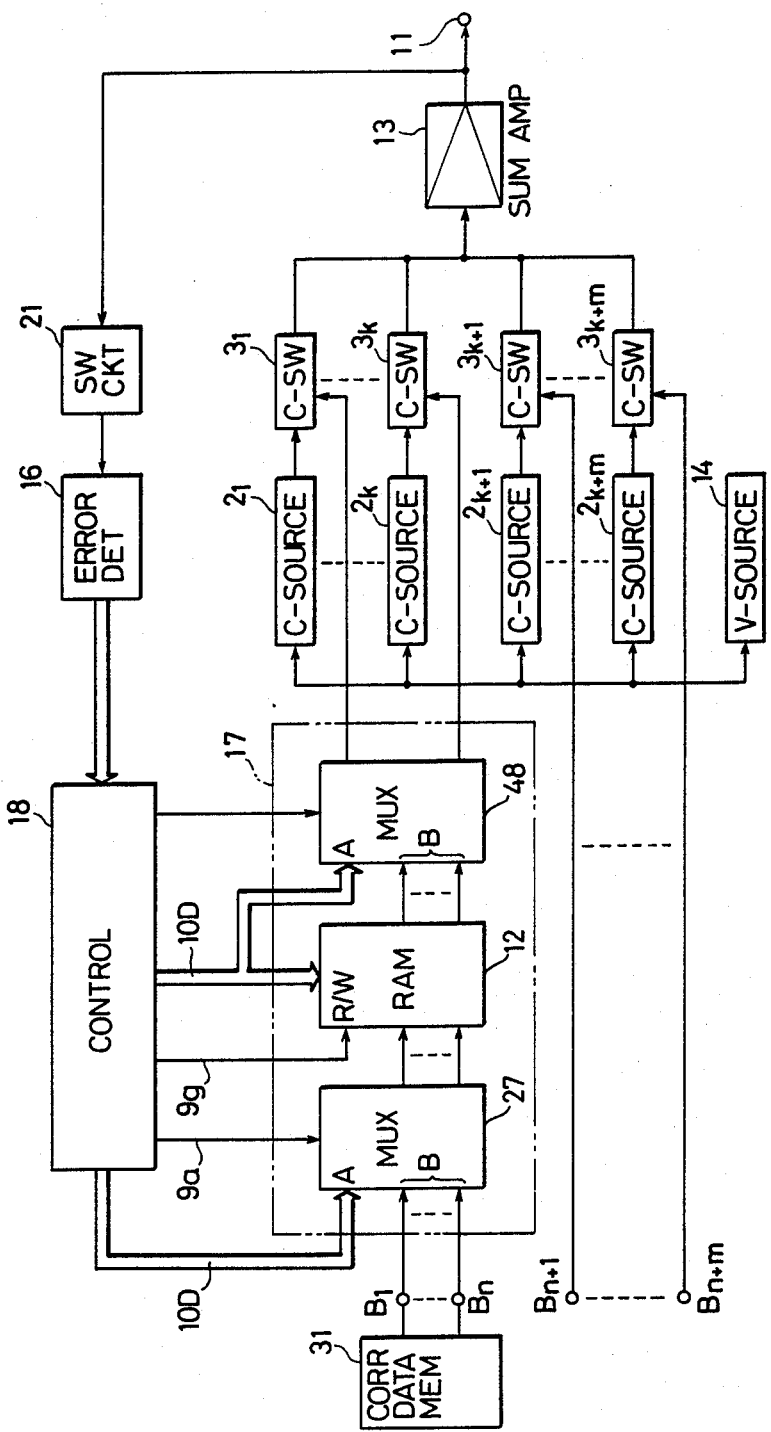
FIG. 23 is a block diagram illustrating another example in which the input/output relationship of the code converting section 17 is made changeable.

After rewriting the contents of the code converter 12 as described above, the multiplexer 27 is controlled by the microcomputer 26 to select its input side "B", i.e. the output side of the corrected data storage circuit 31. In this way, the code converter 12 is controlled so that the conversion for the high-order bits may yield an optimum error, ensuring the providing or high conversion accuracy. As depicted in FIG. 23 in which the parts corresponding to those in FIG. 5 are identified by the same reference numerals, it is also possible to provide a multiplexer 48 at the output side of the code converter 12 and to selectively apply the output of the code converter 12 and the data on the data bus 10D of the microcomputer 26 to the current switches $3_1$ to $3_k$. In such a case, the operation for rewriting the contents of the code converter 12 to such as shown in FIG. 20 is unnecessary. Consequently, the time for changing the input/output relation of the code converter 12 is reduced. Incidentally, in the case of carrying out the error optimizing processing through using the code converter 12 shown in FIGS. 19 or 23, the error optimizing processing is performed prior to the first step S1 in FIG. 7.

If the inverting amplifier 22 employed in the error detecting section 16 has a gain error, the errors of the current sources cannot be detected correctly. It is therefore preferred to arrange the error detecting section 16 so that the error of the inverting amplifier 22 can be automatically calibrated. This automatic calibration can be achieved, for example, by such a circuit arrangement as illustrated in FIG. 24. That is, in the inverting amplifier 22, a negative feedback resistor 52 is connected between the output side and the inverting input side of an operational amplifier 51 and the inverting input side is connected via an input resistor 53 to the output side of the switching circuit 21, the non-inverting input side of the operational amplifier 51 being grounded.

During the operation of calibrating the gain of the inverting amplifier 22, the switching circuit 21 is turned ON by the microcomputer 26 and the switching circuit 23 to connect to the side "b". For instance, the current $I_{15}$ of the high-order bit current source $2_{15}$ is output and the resulting output at the output terminal 11 is provided to the inverting amplifier 22, and then the converted output of the A/D converter 25 is input into the microcomputer 26. Next, the switching circuit 23 is connected to the contact "a", and the converted output of the A/D converter 25 obtained at that time is input into the microcomputer 26. For the case wherein the gain of the inverting amplifier 22 is a predetermined value, unity gain for example, and contains no error, the converted output values of the A/D converter 25 obtained before and after the switching of the switching circuit 23 are equal in absolute magnitude to each other. If the gain of the inverting amplifier 22 contains an error, the error can be obtained from the converted values of the A/D converter 25 before and after the switching of the switching circuit 23. The gain error thus obtained is computed by the microcomputer 26 and a correction value corresponding to this error is set in a register 54. The register 54 supplies the correction value to a D/A converter 55, wherein it is converted into an analog signal. The D/A converter 55 is shown to be what is called a multiplying type. The D/A converter 55 is supplied at its reference voltage terminal with the output of the operational amplifier 51, and the current switches are controlled corresponding to respective bits of the input correction digital value to output binary-weighted currents from the corresponding current switches. The currents are added together and the added current is converted by a current-voltage converter 56 into a voltage, which is applied via an adding resistor 57 to the inverting input side of the inverting amplifier 22, i.e. the operational amplifier 51. The output of the D/A converter 55 is proportional to the product of the output of the inverting amplifier 22 and the correction digital value from the register 54. When the gain of the inverting amplifier 22 is, for example, too small, the output of the D/A converter 55 is provided to the inverting amplifier 22 to compensate for the shortfall of the gain. Conversely, when the gain of the inverting amplifier 22 is too large, the excess gain is removed. To perform this, it is preferable to provide an arrangement such that the output voltage at the output terminal 11 is subtracted by the subtractor 37 from the input.

By such a calibration operation the gain of the inverting amplifier 22 can be calibrated. This operation may be carried out after the second step S2 in FIG. 7.

While in the foregoing the present invention has been described as being applied to the D/A converting apparatus which converts an input digital signal, including its polarity, into an analog signal, the invention is also applicable to such a D/A converting apparatus in which the input digital signal is of only one polarity and the analog converted output is only positive or negative. In this case, the offset current source 19 in FIG. 5 is replaced with a correction current source which corresponds to the current value of one of the high-order bit current sources $2_1$ to $2_k$ and yields a current that is reverse in polarity from that of the current sources. The current errors of the high-order current sources $2_1$ to $2_k$ are detected on the basis of the current of the correction current source. This correction current source can also be used for detecting the errors of the low-order bit current sources. It is also possible that the value corresponding to the current of the correction current source is set in a register 38 of the subtractor 37 in the error detecting section 16.

Although in the foregoing the input digital signal is corrected by the corrected data storage circuit 31 and the adder 32 in accordance with the current error of the current source, it is also possible to correct the output analog signal. For example, as indicated by the broken line in FIG. 5, correction data (the error component alone) corresponding to each input digital value is prestored in a correction data memory 61 from the microcomputer 26 and, by the input digital signal, the correction data memory 61 is read out, the output of which is converted by a D/A converter 62 into an analog signal for input into the adder 13.

As has been described in the foregoing, according to the D/A converting apparatus of the present invention, errors in the current values of the current sources corresponding to high-order bits of an input digital signal are detected and a correct analog output can be obtained which corrects for the errors. In general, it is difficult to prepare a current source which accurately yields a current of a large value at all times; therefore, it has been difficult in the past to obtain a highly accurate converted output. According to the present invention, however, errors can be automatically corrected as described in the foregoing, permitting highly accurate conversion.

In order to hold the linearity error of a D/A converter to below $\pm\frac{1}{2}$ the value of the least significant bit (LSB), it is necessary to reduce the relative error of the current of each current source sufficiently smaller than $\pm\frac{1}{2}$ LSB. This requires the relative error detector to have a wide detecting dynamic range in the case of measuring the absolute value of each current. The present invention is adapted so that, even if the A/D converter 25 of a narrow dynamic range is used in the error detection, errors can be detected equivalently over a wide voltage range. However, the current error of each current source can be detected with high resolution.

As has been described in the foregoing, according to the present invention, errors are detected with high resolution through using a low-precision, simple-structured error detecting section and, by the calibration based on the detected errors, a converted output of excellent linearity can be obtained without involving the use of parts which are particularly demanding in terms of temperature coefficient and secular change. Incidentally, while in the foregoing the currents corresponding to the intermediate bits of the digital input are also calibrated, it is also possible to calibrate only the high-order bits.

It will be apparent that many modifications and variations may be effected without departing from the scope of the novel concepts of the present invention.

What is claimed is:

1. A D/A converting apparatus, for operating in a conversion mode to convert from an input digital signal of a plurality of bits to a respective analog output signal and in a calibration mode for calibrating a group of current sources among a plurality of current sources for providing said analog output signal, said apparatus comprising:
    a code converting section for receiving a high-order bit signal of a plurality of bits and for outputting a respective equal-weighted bit signal of a larger plurality of bits;
    a high-order bit converting section connected to the output of said code converting section for outputting respective equally weighted currents in accordance with respective bits of the equal-weighted bit signal, said high-order bit converting section including a respective plurality of equal-weighted ones of said plurality of current sources for respectively outputting said equally-weighted currents;
    a binary bit converting section for receiving a lower-order bit signal of a respective number of bits and, in accordance with each respective bit thereof, for outputting respective binary-weighed currents, said binary bit converting section including a respective number of binary-weighted ones of said plurality of current sources for respectively providing said binary-weighted currents;
    a summing amplifier connected to the outputs of said high-order bit and binary bit converting sections for summing the output currents therefrom to produce at an output terminal of said summing amplifier each respective analog output signal;
    correcting means for receiving, during said conversion mode, each said input digital signal to be converted into a respective analog output signal, and for outputting respective ones of said high-order and lower-order bit signals, based on a respective set of corrected high-order bit data and corrected lower-order bit data, said correcting means including:
    a corrected data memory for receiving as an address a predetermined number of higher-order bits of said input digital signal and reading out therefrom corrected data composed of a set of corrected higher-order and low-order bit data stored therein; and
    a digital adder for adding said corrected low-order data read out from said corrected data memory to corresponding low-order bits in said input digital signal to produce summed low-order bit data;
    a predetermined number of high-order bits in said corrected higher-order bit data delivered from said corrected data memory being used as said high-order bit signal supplied to said code converting section and a combination of the remaining bits in said corrected higher-order bit data and said summed low-order bit data delivered from said digital adder being used as said lower-order bit signal supplied to said binary bit converting section, respectively;
    a microcomputer for generating, during said calibration mode, selection signals to produce, for each said current source to be calibrated, at least one sequence of respective selective states, wherein each said selecting state designates a respective ON or OFF state for at least one respective one of said group of current sources to be calibrated for producing the respective currents to said summing amplifier; and
    difference detecting means, connected during said calibration mode, to the output of said summing amplifier, for detecting a difference between the respective analog output signals of each said pair of selecting states;
    wherein said microcomputer computes from the respective detected differences current errors for said current sources to be calibrated, computes therefrom each said respective set of said corrected high-order bit data and corrected lower-order bit data for each possible value of the input digital signal, and stores same in said corrected data memory.

2. The apparatus of claim 1, comprising:
an offset D/A converter for producing, in response to a set value supplied thereto from said microcomputer, an offset control analog signal; and
an offset current source connected to the output of said offset D/A converter, for producing an offset current in accordance with the offset control analog signal, and for supplying the offset current to said summing amplifier.

3. The apparatus of claim 1, wherein:
said input digital signal is composed of the higher-order bits, which are to be supplied as the address for said corrected data memory and which corresponds to those of the current sources to be calibrated, and the low-order bits which are supplied to said adder and which correspond to those of the current sources not to be calibrated; and
said corrected lower-order bit data in said corrected data from said corrected data memory is composed of a corrected intermediate-order bit data having a number of bits corresponding to the number of the binary-weighted current sources to be calibrated and said corrected low-order bit data to be supplied to said adder.

4. The apparatus of claim 1 wherein all of said current sources to be calibrated have output currents of the same polarity, and said correcting means comprises a correction current source of the same polarity as that of the current sources to be calibrated, for supplying a respective correction current to said summing amplifier.

5. The apparatus of claim 1, wherein said microcomputer determines an input-output relationship between the high-order bit signals and the equally-weighted bit signals, so that respective ones of said equal-weighted current sources are selected to optimize the total error of each selected set of at least one equal-weighted current sources according to the respective high-order bit signals, and changes the input-output relationship, between said high-order bit signal and said equal-weighted bit signals of said code converting section, for agreement with the results of the optimization.

6. The apparatus of claim 1, wherein said group of current sources to be calibrated includes at least all but one of said equal-weighted current sources, wherein any of said binary-weighted current sources to be calibrated are those having the largest of said binary-weighted currents, and wherein the largest of said binary-weighted currents is binary-weighted with respect to each said equally-weighted current.

7. The apparatus of claim 1, or wherein said difference detecting means comprises a DC cutting off means connected to said output terminal for substantially cutting off a DC component of said analog output signal, and an A/D converter connected to said DC cutting off means for converting the output from said DC cutting off means during each said sequence of said pairs of selecting states.

8. The apparatus of claim 1, wherein said difference detecting means comprises DC cutting off means, an inverting amplifier, switching means for selectively connecting the input and the output of said inventing amplifier to the input and the output of said DC cutting off means, and an A/D converter for converting the output of said DC cutting off means into digital signals during the setting of each respective pair of said selecting states.

9. The apparatus of claim 1, comprising:
analog signal generating means for generating a cancelling analog signal in accordance with a set value supplied from said microcomputer during the setting of at least one selecting state of each of the respective pairs thereof; and
a subtractor for providing each respective difference between the respective analog output signals from said output terminal and the cancelling analog signal to said difference detecting means;
wherein said microcomputer computes the sum of the set value and the output of said difference detecting means obtained during said at least one selecting state to compensate for the cancellation by said cancelling analog signal.

10. A D/A converting apparatus, for operating in a conversion mode to convert from an input digital signal of a plurality of bits to a respective analog output signal and in a calibration mode for calibrating a group of current sources among a plurality of current sources for providing said analog output signal, said apparatus comprising:
a code converting section for receiving a high-order bit signal of a plurality of bits and for outputting a respective equal-weighted bit signal of a larger plurality of bits;
a high-order bit converting section connected to the output of said code converting section for outputting respective equally-weighted currents in accordance with respective bits of the equal-weighted bit signal, said high-order bit converting section including a respective plurality of equal-weighted ones of said plurality of current sources for respectively outputting said equally-weighted currents;
a binary bit converting section for receiving a lower-order bit signal of a respective number of bits and, in accordance with each respective bit thereof, for outputting respective binary-weighted currents, said binary bit converting section including a respective number of binary-weighted ones of said plurality of current sources for respectively providing said binary-weighted currents;
a summing amplifier connected to the outputs of said high-order bit and binary bit converting sections for summing the output currents therefrom to produce at an output terminal of the summing amplifier each respective analog output signal;
correcting means for receiving, during said conversion mode, each said input digital signal to be converted into a respective analog output signal, and for outputting respective ones of said high-order and lower-order bit signals, based on a respective set of corrected high-order bit data and corrected lower-order bit data;
a microcomputer for generating, during said calibration mode, selection signals to produce, for each said current source to be calibrated, at least one sequence of respective selecting states, wherein each said selecting state designates a respective ON or OFF state for at least one respective one of said group of current sources to be calibrated for providing the respective currents to said summing amplifier;
difference detecting means, connected, during said calibration mode, to the output of said summing amplifier, for detecting a difference between the respective analog output signals of each said pair of selecting states;
said microcomputer computing from the respective detected differences current errors for said current sources to be calibrated, computing therefrom each said respective set of said corrected high-order bit data and corrected lower-order bit data for each possible value of the input digital signal, and suppling same to said correcting means;
said current sources being calibrated to include all of said equal-weighted current sources;
a predetermined number of higher order bits of each said input digital signal provide a respective higher-order bit signal in correspondence to said current sources to be calibrated, and the remaining lower order bits of each said input digital signal provide a respective input low-order bit signal the bits of which corresponding to those of said binary-weighted current sources which are not to be calibrated;
said correcting means comprising a corrected data memory for respectively storing each said set of corrected high-order and lower-order bit data, said corrected lower-order bit data being composed of a corrected intermediate-order bit data having a number of bits corresponding to the number of the binary-weighted current sources to be calibrated and a corrected lower-order bit data corresponding to those of the binary-weighted current sources not to be calibrated, and an adder for adding said corrected low order bit data from said corrected data memory and said input lower-order bit signal;
said input higher-order bit signal is used as an address for accessing said corrected data memory to read out the corresponding set of said corrected high-order and corrected lower-order bit data, and said correcting means outputs said corrected high-order bit data as said high-order bit signal and the output of the said adder as said lower-order bit signal;

said adder having an overflow output; and said correcting means including an overflow correction current source connected to receive said overflow output and to provide as an output to said summing amplifier a current having the same weight and the same polarity as the one of any of said binary-weighted current sources to be calibrated which is smallest of said binary-weighted currents.

11. A converter for converting an input digital signal to an output analog signal, comprising:

a plurality of current sources for selectively providing respective output currents, including a respective plurality of equal-weighted current sources having equal nominal values for their output currents and a respective plurality of binary-weighted current sources the output currents of which are nominally binary-weighted;

a summer for summing the output currents at least of selected ones of said current sources and to output said output analog signal in correspondence to the summing;

error detecting means for determining error data corresponding to at least relative errors of the nominal values of said output currents of a group of said current sources, based on differences in the output of the summer corresponding to respective predetermined combinations of currents including the respective output currents of said current sources; and control means for controlling selection of said current sources and for determining from said error data, respective correction data for each value of said input digital signal, said control means comprising:

a corrected data memory for storing the respective correction data and receiving as an address a predetermined number of higher-order bits of said input digital signal and reading out therefrom the respective correction data composed of a set of corrected higher-order and low-order bit data stored therein; and a digital adder for adding said corrected low-order bit data read out from said corrected data memory to corresponding low-order bits in said input digital signal to produce summed low-order bit data;

a predetermined number of high-order bits in said corrected higher-order bit data delivered from said corrected data memory being used as a high-order bit signal and a combination of the remaining bits in said corrected higher-order bit data and said summed low-order bit data delivered from said digital adder being used as a lower-order bit signal, the high-and lower-order bit signals being used to control the selection of said current sources, output currents from respective ones of said current sources being selected to be supplied to said summer, according to both the respective input digital signal and the respective correction data, for providing said analog output signal.

12. The convertor of claim 11, wherein the output current of each said equally-weighted current source is nominally twice the output current of the one of said binary-weighted current sources having the largest output current, and said group of current sources for which said error data is determined includes at least all but one of said equal-weighted current sources.

13. The converter of claim 12, wherein:

said input digital signal is a binary signal, a plurality of the lowest order bits of which have a one-to-one correspondence with a group of any of said binary-weighted current sources having the lowest output currents and for which said correction data is not to be determined, and a plurality of the highest order bits of which correspond to said equal-weighted current sources; and said group of current sources for which said correction data is determined are associated with a respective plurality of the higher order bits of said input digital signal.

14. The converter of claim 13, said control means comprising:

a control section for controlling when said error data and correction data are to be determined and for generating selection commands for selecting the output currents to be provided to said summer for generating the error data;

a code converter for converting from a signal corresponding to said higher order bits of said input digital signal corresponding to said equal-weighted current sources to a respective plurality of individual output signals for selecting the output currents of said equally weighted current sources to be supplied to said summer; and a multiplexer receiving said individual output signals and said selection commands for providing same to select said equal-weighted current sources according to said microcomputer.

15. The converter of claim 12, 13, comprising a further current source providing a respective output current to said summer, and said control means including means for adjustably setting the output current of said further current source.

16. The converter of claim 12, 13, said control means comprising means for selecting from said equal-weighted current sources on the basis of the respective differences between the actual and nominal values, so as to minimize the errors associated with the respective outputs of said summer corresponding to predetermined values of the said higher order bits of said input digital signal corresponding to said equal-weighted current sources.

17. A converter for converting an input digital signal to an output analog signal, comprising:

a plurality of current sources for selectively providing respective output currents, including a respective plurality of equal-weighted current sources having equal nominal values for their output currents and a respective plurality of binary-weighted current sources the output currents of which are nominally binary-weighted, the output current of each said equally-weighted current source is nominally twice the output current of the one of said binary-weighted current sources having the largest output current;

a summer for summing the output currents at least of selected ones of said current sources and to output said output analog signal in correspondence to the sum;

error detecting means for determining error data corresponding to at least relative errors of the nominal values of said output currents of a group of said current sources, based on differences in the output of the summer corresponding to respective predetermined combinations of currents including respective output currents of said current sources, said group of current sources for which said error data is determined includes at least all but one of said equal-weighted current sources, said input digital signal is a binary signal, a plurality of the lowest order bits of which have a one-to-one correspondence with a group of any of said binary-weighted current sources having the lowest output currents and for which said correction data is not to be determined, and a plurality of the highest order bits of which correspond to said equal-weighted current sources, said group of current sources for which said correction data is determined are associated with a respective plurality of the higher order bits of said input digital signal, said error detecting means comprising:

a switch for selectively outputting a first signal corresponding to said output of the summer, a second signal, and ground potential; and an analog-to-digital converter for converting a signal corresponding to the output of said switch to a digital value;

control means for determining from said error data a respective correction data for each value of said input digital signal;

the output currents from respective ones of said current sources being selected to be supplied to said summing amplifier according to both the respective input digital signal and the respective correction data, and for providing an analog output signal;

a selected one of a subtractor and a high-pass filter connected between the output of said switch and said analog-to-digital converter;

and inverter for inverting said signal corresponding to said output of the summer for supplying said second signal to said switch; and said subtractor subtracting a selected value from the input to said analog-to-digital converter to allow said converter to have a narrow dynamic range.

18. The converter of claim 17, comprising a subtractor connected to receive said output of the summer and for outputting said signal corresponding to said output of the summer.

19. The converter of claim 17, comprising a flying capacitor circuit connected to receive said output of the summer and to output said second signal to said switch.

20. The converter of claim 17, comprising means for adjusting the gain of said inverter.

21. A converter for converting an input digital signal to an output analog signal, comprising:

a plurality of current sources for selectively providing respective output currents, including a respective plurality of equal-weighted current sources having equal nominal values for their output currents and a respective plurality of binary-weighted, current sources the output currents of which are nominally binary-weighted the output current of each said equally-weighted current source is nominally twice the output current of the one of said binary-weighted current sources having the largest output current;

a summer for summing the output currents at least of selected ones of said current sources and to output said output analog signal in correspondence to the sum;

error detecting means for determining error data corresponding to at least relative errors of the nominal values of said output currents of a groups of said current sources, based on differences in the output of the summer corresponding to respective predetermined combinations of currents including respective output currents of said current sources and said group of current sources for which said error data is determined includes at least al but one of said equal-weighted current sources;

control means for determined for said error data respective correction data for each value of said input digital signal;

the output currents from respective ones of said current sources are being selected to be supplied to said summing amplifier according to both the respective input digital signal and the respective correction data for providing an analog output signal;

a further current source having an output current equal to that of the current source having the smallest output current for which said error data is to be determined; and means for controlling the supply of the output current of said further current source to said summer according to an overflow of said adder.

22. A D/A converting apparatus, for operating in a conversion mode to convert from an input digital signal of a plurality of bits to a respective analog output signal and in a calibration mode for calibrating a group of current sources among a plurality of current sources for providing said analog output signal, said apparatus comprising:

a code converting section for receiving a high-order bit signal of a plurality of bits and for outputting a respective equal-weighted bit signal of a larger plurality of bits;

a high-order bit converting section connected to the output of said code converting section for outputting respective equally weighted currents in accordance with respective bits of the equal-weighted bit signal, said high-order bit converting section including a respective plurality of equal-weighted ones of said plurality of current sources for respectively outputting said equally-weighted currents;

a binary bit converting section for receiving a lower-order bit signal of a respective number of bits and, in accordance with each respective bit thereof, for outputting respective binary-weighted currents, said binary bit converting section including a respective number of binary-weighted ones of said plurality of current sources for respectively providing said binary-weighted currents, at least one of said binary-weighted current sources is to b e calibrated and the output currents of each said binary-weighted current source to be calibrated and of a first one of said equally-weighted current sources have the same polarity;

current subtracting means for supplying a current of the same value but of opposite polarity as the output current of said first equally-weighted current source to said summing amplifier during the occurrence of each respective pair of said selecting states corresponding to each said binary-weighted current source to be calibrated;

a summing amplifier connected to the oututs of said high-order bit and binary bit converting sections for summing the output currents therefrom to produce at an output terminal of the summing amplifier each respective analog output signal;

correcting means for receiving, during said conversion mode, each said input digital signal to be converted into a respective analog output signal, and for outputting respective ones of said high-order and lower-order bit signals, based on a respective set of corrected high-order bit data and corrected lower-order bit data;

a microcomputer for generating, during said calibration mode, selection signals to produce, for each said current source to be calibrated, at least one sequence of respective selecting states, wherein each said selecting state designates a respective ON or OFF state for at least one respective one of said group of current sources to be calibrated for providing the respective currents to said summing amplifier;

difference detecting means connected, during said calibration mode, to the output of said summing amplifier for detecting a difference between the respective analog output signals of each said pair of selecting states; and said microcomputer computing from the respective detected differences current errors for said current sources to be calibrated, computing therefrom each said respective set of said corrected high-order bit data and corrected lower-order bit data for each possible value of the input digital signal, and suppling same to said correcting means;

said first one of said equal-weighted current sources is used as a reference current source; and said microcomputer producing said pairs of selection signals such that, in a first selecting state of the respective pair of said selecting states corresponding to each said binary-weighted current source to be calibrated, said reference current source and the respective binary-weighted current source to be calibrated are turned ON, and, in the other selecting state of the respective pair of selecting states, the respective binary-weighted current source to be calibrated and all the binary-weighted current sources with higher output currents are turned ON.

23. The apparatus of claim 22, wherein said current subtracting means comprises a plurality of predetermined ones of said equal-weighted current sources excluding said reference current source, and and offset current source for producing a current equal to but opposite in polarity from the sum of said predetermined ones of said equal-weighted current sources and said reference current source.

24. A/D converting apparatus, for operating in a conversion mode to convert from an inpyt digital signal of a plurality of bits to a respective analog output signal and in a calibration mode for calibrating a group of current sources among a plurality of current sources for providing said analog output signal, said apparatus comprising:

a code converting section for receiving a high-order bit signal of a plurality of bits and for outputting a respective equal-weighted bit signal of a larger plurality of bits;

a high-order bit converting section connected to the output of said code converting section for outputting respective equally-weighted currents in accordance with respective bits of the equal-weighted bit signal, said high-order bit converting section including a respective plurality of equal-weighted ones of said plurality of current sources for respectively outputting said equally-weighted currents;

a binary bit converting section for receiving a lower-order bit signal of a respective number of bits and, in accordance with each respective bit thereof, for outputting respective binary-weighted currents, said binary bit converting section including a respective number of binary-weighted ones of said plurality of current sources for respective providing said binary-weighted currents;

a summing amplifier connected to the outputs of said high-order bit and binary bit converting sections for summing the output currents therefrom to produce at an output terminal of the summing amplifier each respective analog output signal;

correcting means for receiving, during said conversion mode, each said input digital signal to be converted into a respective analog output signal, and for outputting respective ones of said high-order and lower-order bit signals, based on a respective set of corrected high-order bit data and corrected lower-order bit data;

a microcomputer for generating, during said calibration mode, selection signals to produce, for each said current source to be calibrated, at least one sequence of respective selecting states, wherein each said selecting state designates a respective ON or OFF state for at least one respective one of said group of current sources to be calibrated for providing the respective currents to said summing amplifier;

difference detecting means connected, during said calibration mode, to the output of said summing amplifier for detecting a difference between the respective analog output signals of each said pair of selecting states;

said microcomputer computing from the respective detected differences current errors for said current sources to be calibrated, computing therefrom each said respective set of said corrected high-order bit data and corrected lower-order bit data for each possible value of the input digital signal, and suppling same to said correcting means;

a reference current source for producing a reference current equal to but opposite in polarity to the current of a first one of said equal-weighted current sources; and the current sources to be calibrated including at least one of said binary-weighted current sources with the largest of said binary-weighted currents, and said microcomputer producing said selection signals such that in a first one of the respective pair of selecting states for each respective binary-weighted current source to be calibrated, the reference current source and any of the binary-weighted current sources with a larger binary-weighted current are turned ON and in the other selecting state of the respective pair only the respective binary-weighted current source to be calibrated is turned ON.

* * * * *